US008456186B2

(12) United States Patent
Takekoshi et al.

(10) Patent No.: US 8,456,186 B2
(45) Date of Patent: Jun. 4, 2013

(54) RELIABILITY EVALUATION TEST APPARATUS, RELIABILITY EVALUATION TEST SYSTEM, CONTACTOR, AND RELIABILITY EVALUATION TEST METHOD

(75) Inventors: Kiyoshi Takekoshi, Nirasaki (JP); Hisatomi Hosaka, Nirasaki (JP); Junichi Hagihara, Nirasaki (JP); Kunihiko Hatsushika, Nirasaki (JP); Takamasa Usui, Fujisawa (JP); Hisashi Kaneko, Fujisawa (JP); Nobuo Hayasaka, Yokosuka (JP); Yoshiyuki Ido, Ibi-gun (JP)

(73) Assignees: Tokyo Electron Limited, Tokyo (JP); Ibiden Co., Ltd., Ogaki-shi (JP)

( * ) Notice: Subject to any disclaimer, the term of this patent is extended or adjusted under 35 U.S.C. 154(b) by 1105 days.

(21) Appl. No.: 11/769,432

(22) Filed: Jun. 27, 2007

(65) Prior Publication Data
US 2008/0018355 A1   Jan. 24, 2008

Related U.S. Application Data

(60) Division of application No. 11/179,538, filed on Jul. 13, 2005, now Pat. No. 7,242,206, which is a division of application No. 10/813,257, filed on Mar. 31, 2004, now Pat. No. 7,091,733, which is a continuation of application No. PCT/JP02/12348, filed on Nov. 27, 2002.

(30) Foreign Application Priority Data

Nov. 30, 2001   (JP) ................................. 2001-367268

(51) Int. Cl.
*G01R 31/02* (2006.01)
*G01R 31/00* (2006.01)

(52) U.S. Cl.
USPC ............. 324/762.01; 324/762.05; 324/750.03

(58) Field of Classification Search
USPC ........................................ 324/754–765, 158.1
See application file for complete search history.

(56) References Cited

U.S. PATENT DOCUMENTS 4,567,432 A    1/1986   Buol et al.
4,899,107 A *  2/1990   Corbett et al. ................ 324/765
(Continued)

FOREIGN PATENT DOCUMENTS

CN    1258096 A       6/2000
EP    0 253 746 A1 *  1/1988
(Continued)

OTHER PUBLICATIONS

Patents Abstracts of Japan, JP 2001-281293, Oct. 10, 2001.*

(Continued)

*Primary Examiner* — Vinh Nguyen
(74) *Attorney, Agent, or Firm* — Oblon, Spivak, McClelland, Maier & Neustadt, L.L.P.

(57) ABSTRACT

A reliability evaluation test apparatus of this invention includes a wafer storage section which stores a wafer in a state wherein the electrode pads of a number of devices formed on the wafer and the bumps of a contactor are totally in electrical contact with each other. The wafer storage section transmits/receives a test signal to/from a measurement section and has a hermetic and heat insulating structure. The wafer storage section has a pressure mechanism which presses the contactor and a heating mechanism which directly heats the wafer totally in contact with the contactor to a predetermined high temperature. The reliability of an interconnection film and insulating film formed on the semiconductor wafer are evaluated under an accelerated condition.

23 Claims, 16 Drawing Sheets

U.S. PATENT DOCUMENTS

| | | | |
|---|---|---|---|
| 5,071,058 A | | 12/1991 | Nowotarski |
| 5,210,485 A | * | 5/1993 | Kreiger et al. .................. 324/758 |
| 5,302,891 A | * | 4/1994 | Wood et al. .................... 324/765 |
| 5,440,240 A | * | 8/1995 | Wood et al. .................... 324/765 |
| 5,440,241 A | * | 8/1995 | King et al. ..................... 324/765 |
| 5,532,610 A | * | 7/1996 | Tsujide et al. ................. 324/757 |
| 5,539,324 A | * | 7/1996 | Wood et al. .................... 324/758 |
| 5,605,844 A | | 2/1997 | Oki et al. |
| 5,701,666 A | * | 12/1997 | DeHaven et al. ................ 29/831 |
| 5,945,834 A | | 8/1999 | Nakata et al. |
| 5,949,246 A | | 9/1999 | Frankeny et al. |
| 5,952,840 A | | 9/1999 | Farnworth et al. |
| 6,005,401 A | * | 12/1999 | Nakata et al. ................... 324/754 |
| 6,084,215 A | | 7/2000 | Furuya et al. |
| 6,124,725 A | | 9/2000 | Sato |
| 6,239,590 B1 | * | 5/2001 | Krivy et al. ............... 324/750.02 |
| 6,265,888 B1 | | 7/2001 | Hsu |
| 6,329,831 B1 | | 12/2001 | Bui et al. |
| 6,459,285 B1 | | 10/2002 | Okabe |
| 6,580,282 B1 | | 6/2003 | Lieutard et al. |
| 2004/0060436 A1 | | 4/2004 | Parekh et al. |

FOREIGN PATENT DOCUMENTS

| | | | |
|---|---|---|---|
| EP | 0 841 571 A2 | * | 5/1998 |
| EP | 0 907 085 A1 | * | 4/1999 |
| JP | 8-340030 | | 12/1996 |
| JP | 9-64141 | * | 3/1997 |
| JP | 11-64389 | * | 3/1999 |
| JP | 11-163066 | * | 6/1999 |
| JP | 2000-346875 | * | 12/2000 |
| JP | 2001-56346 | | 2/2001 |
| JP | 2001-156128 | | 6/2001 |
| JP | 2001-203244 | * | 7/2001 |
| JP | 2001-223247 | | 8/2001 |
| JP | 2001-266983 | | 9/2001 |
| JP | 2001-281293 | * | 10/2001 |
| JP | 2001-313320 | * | 11/2001 |
| JP | 2002-329759 | * | 11/2002 |
| WO | WO 01/04643 A2 | | 1/2001 |

OTHER PUBLICATIONS

Justin Leung et al; "Active Substrate Membrane Probe Card"; Electron Devices Meeting, 1995; XP-010161090; Dec. 10, 1995; pp. 709-712.*

European Office Action dated Feb. 3, 2009 in European Patent Application No. 06 009 917.3.

Chinese Office Action dated Apr. 7, 2009 in Chinese Patent Application No. 2006/101318303 (with English translation).

Office Action mailed Mar. 23, 2006 in co-pending U.S. Appl. No. 11/179,538.

Office Action issued Jan. 12, 2009, in Japanese Patent Application No. 2007-148693, dated Sep. 7, 2010 (with English Translation).

* cited by examiner

RELIABILITY EVALUATION TEST APPARATUS, RELIABILITY EVALUATION TEST SYSTEM, CONTACTOR, AND RELIABILITY EVALUATION TEST METHOD

CROSS-REFERENCE TO RELATED APPLICATIONS

This application is a divisional of and claims the benefit of priority under 35 U.S.C. §120 from U.S. Ser. No. 11/179,538, now U.S. Pat. No. 7,242,206, which is a divisional of application Ser. No. 10/813,257, filed Mar. 31, 2004, now U.S. Pat. No. 7,091,733, issued Aug. 15, 2006, which is a continuation of PCT Application No. PCT/JP02/12348, filed Nov. 27, 2002, which was not published under PCT Article 21(2) in English. This application is based upon and claims the benefit of priority from the prior Japanese Patent Application No. 2001-367268, filed Nov. 30, 2001, the entire contents of which are incorporated herein by reference.

BACKGROUND OF THE INVENTION

1. Field of the Invention

The present invention relates to a reliability evaluation test apparatus, reliability evaluation test system, contactor, and reliability evaluation test method and, more particularly, to a reliability evaluation test apparatus, reliability evaluation test system, contactor, and reliability evaluation test method, which are used to evaluate/test the reliability of interconnections and insulating films which form multilayered Interconnections for a number of semiconductor devices formed on a semiconductor wafer.

2. Description of the Related Art

In a semiconductor testing process, the electrical characteristics of a number of semiconductor elements (to be referred to as "devices" hereinafter) formed on the surface of a semiconductor wafer (to be referred to as a "wafer" hereinafter) are tested in a wafer state, and devices having no failures in the electrical characteristics are screened. Then, in the final step of testing process, wafer dicing is performed, and reliability evaluation tests such as an electromigration test for the multilayered interconnections of each device and a leakage current test between interconnections in the same plane or between upper and lower interconnections are conducted under accelerated conditions of the temperature and the like.

In a reliability evaluation test, test packages are prepared. Devices are packaged in these packages. Subsequently, the reliability evaluation test of, e.g., approximately 70 packaged devices is executed in a furnace at a predetermined high temperature (e.g., 300° C.)

BRIEF SUMMARY OF THE INVENTION

However, for the conventional reliability evaluation test that is to be conducted in a furnace, wafer dicing is performed, and test packages are prepared. Devices are packaged using these test packages. For this reason, considerable time and cost are required for wafer dicing, test package preparation, and device packaging. In addition, the conventional test executed in the furnace can handle only tens of packages, i.e., only tens of devices at once.

When devices having metal interconnections made of, e.g., copper or a copper alloy that readily oxidize are to be tested, an inert gas is introduced in the furnace. However, since the furnace is poor in sealing properties, for example, the oxygen concentration cannot be made low enough to prevent oxidation of copper interconnections. For this reason, not only the pad portions of copper interconnections but also the copper interconnections themselves are oxidized through the pad portions. To prevent this, an anti-oxidizing aluminum pad layer must be added to each copper pad portion at the time of wafer sample preparation. Furthermore, when a plurality of types of samples are to be tested, the dicing and wire bonding must be changed in correspondence with each type. Hence, three or more weeks are required before a reliability evaluation test result can be obtained.

Moreover, data such as important parameters for the reliability test or dependence related to various test patterns must be acquired by executing a test a plurality of times. Hence, the test efficiency is low. For, e.g., an electromigration test, the positions of voids generated by electromigration need to be observed, and the observation result is fed back to process development later. For this observation, test packages are disassembled to extract devices one by one, bonding wires are detached from each device, and each device is observed under a microscope. To do this, a great deal of labor and time are necessary.

The present invention has been made to solve the above problems.

An invention according to an aspect of the present invention has as its object to provide a reliability evaluation test apparatus, reliability evaluation test system, contactor, and reliability evaluation test method, which can quickly, efficiently, and reliably execute a reliability evaluation test of a plurality of semiconductor devices formed on a wafer.

An invention according to another aspect of the present invention has as its object to provide a reliability evaluation test apparatus, reliability evaluation test system, contactor, and reliability evaluation test method, which can greatly reduce the labor and cost required for a reliability evaluation test.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

According to a first aspect of the present invention, there is provided an apparatus which tests a reliability of a semiconductor wafer on the basis of a test signal from a measurement unit, comprising a measurement section and a storage section which has a hermetic and insulating structure, stores a semiconductor wafer that is totally in electrical contact with a contactor and transmits/receives a test signal to/from the measurement section.

The reliability evaluation test apparatus comprises a pressure mechanism which presses the contactor in the storage section, and a heating mechanism which heats the semiconductor wafer that is totally brought into contact with the contactor by the pressure mechanism to a predetermined high temperature.

The reliability evaluation test apparatus evaluates reliabilities of a multilayered interconnection and an insulting film, which are formed on the semiconductor wafer, under an accelerated condition.

The apparatus provided in accordance with the first aspect also preferably comprises one of (a1) to (a14) below or a combination of a plurality of components from (a1) to (a14).

(a1) A table which has a heat insulating structure and on which the semiconductor wafer is placed, a connection ring which surrounds the table and comes into electrical contact with the contactor, and a wiring board which comes into electrical contact with the connection ring and transmits/ receives the test signal from the measurement section, which are arranged in the storage section.

(a2) A seal member which comes into contact with the contactor to seal a space in the storage section from an outside, and means for supplying an inert gas and/or reducing gas into the storage section, which are arranged on the connection ring.

(a3) A pressure plate which presses the contactor, a bellows whose lower end is connected to the pressure plate, a support which is connected to an upper end of the bellows and can move vertically, and means for supplying a gas into a space formed by the pressure plate, the bellows, and the support, which are arranged in the pressure mechanism.

(a4) A heater which uniformly heats an entire surface of the semiconductor wafer from a lower surface side and also serves as the table, which is arranged in the heating mechanism.

(a5) A first heating portion which heats a central portion of the semiconductor wafer, and a second heating portion which surrounds the first heating portion and heats an outer edge portion of the semiconductor wafer, which are arranged in the heater.

(a6) An auxiliary heater which heats the entire surface of the semiconductor wafer from an upper surface side, which is arranged in the heating mechanism.

(a7) An electromigration measurement section and a leakage current measurement section, which are arranged in the measurement section.

(a8) A switching mechanism which alternately switches between the measurement sections.

(a9) The electromigration measurement section comprises a function of supplying three kinds of currents including a DC current, a pulse DC current, and an AC current.

(a10) A plurality of test patterns formed on the semiconductor wafer, and test pattern grouping function means for putting the plurality of test patterns into groups and executing a reliability evaluation test for not less than five groups simultaneously.

(a11) An anisotropic conductive film arranged between the contactor and the semiconductor wafer.

(a12) Means for simultaneously executing a reliability evaluation test of not less than 100 semiconductor devices formed on the semiconductor wafer, which is arranged in the measurement section.

(a13) A heat insulating structure which maintains the semiconductor wafer at a temperature of not less than 160° C., which is arranged in the storage section.

(a14) A heat-resistant substrate having a thermal expansion coefficient of 1 to 50 ppm/° C., which is arranged in the contactor.

According to a second aspect of the present invention, there is provided a reliability evaluation test system comprising an aligner which totally brings a contactor into contact with a semiconductor wafer, a transfer tool which transfers the contactor and the semiconductor wafer, which are totally kept in contact with each other by the aligner, and a reliability evaluation test apparatus provided in accordance with the first aspect of the present invention, which executes a reliability evaluation test of the semiconductor wafer integrated with the transfer tool.

The reliability evaluation test system provided in accordance with the second aspect also preferably comprises one of (b1) to (b4) below or a combination of a plurality of components from (b1) to (b4).

(b1) Means for allowing data communication between the aligner and the reliability evaluation test apparatus.

(b2) A microscope to observe the semiconductor wafer on the basis of a test result of the semiconductor wafer, which is arranged in the aligner.

(b3) A magnet to integrate the contactor and the semiconductor wafer, which is arranged in the transfer tool.

(b4) A magnetic circuit, switch means for turning on/off the magnetic circuit, and means for exciting/degaussing the magnetic circuit to cause the transfer tool to attract/release the contactor and the semiconductor wafer, which are arranged in the transfer tool.

According to a third aspect of the present invention, there is provided a contactor which comprises a heat-resistant substrate having a thermal expansion coefficient of 1 to 50 ppm/° C., and a conductor circuit formed on the heat-resistant substrate, and is used to execute a reliability evaluation test at a temperature of not less than 160° C.

The contactor provided in accordance with the third aspect also preferably comprises one of (c1) to (c3) below or a combination of a plurality of components from (c1) to (c3).

(c1) A bump arranged in the conductor circuit.

(c2) The heat-resistant substrate formed from at least one material selected from a heat-resistant resin, a metal, a semiconductor, and a ceramic.

(c3) An insulating coating formed on a surface except a portion which is electrically connected in executing the reliability evaluation test.

According to a fourth aspect of the present invention, there is provided a reliability evaluation test method of executing different reliability evaluation tests for a semiconductor wafer in a state wherein the semiconductor wafer and a contactor are totally in electrical contact with each other.

According to a fifth aspect of the present invention, there is provided a reliability evaluation test method of executing a reliability evaluation test for a semiconductor wafer by pressing the semiconductor wafer which is totally in electrical contact with a contactor, heating the semiconductor wafer to not less than 160° C., and rendering the semiconductor wafer conductive.

The reliability evaluation test methods provided in accordance with the fourth and fifth aspects also preferably comprise one of (d1) to (d5) below or a combination of a plurality of components from (d1) to (d5).

(d1) Simultaneously executing the reliability evaluation test for not less than 100 semiconductor devices on the semiconductor wafer.

(d2) Executing an electromigration test and/or a leakage current test as the reliability evaluation test.

(d3) Controlling a temperature distribution in a surface of the semiconductor wafer within ±2.0° C. at a range of 160° C. to 350° C.

(d4) Placing the semiconductor wafer and the contactor in one of an inert gas atmosphere and an atmosphere of an inert gas mixed with a reducing gas.

(d5) Setting an oxygen concentration to not more than 100 ppm. Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

BRIEF DESCRIPTION OF THE SEVERAL
VIEWS OF THE DRAWING

FIGS. 1A and 1B are views showing a reliability evaluation test apparatus according to an embodiment of the present invention, in which FIG. 1A is a view showing main part, and FIG. 1B is a perspective view showing a controller;

FIGS. 3A and 3B are views showing a contactor according to an embodiment of the present invention, in which FIG. 3A is a sectional view, and FIG. 3B is a plan view;

FIGS. 5A and 5B are views showing an example of an aligner which aligns a wafer and a contactor, in which FIG. 5A is a perspective view showing the outer appearance, and FIG. 5B is a sectional view showing a fixing mechanism;

Figures 8A, 8B:
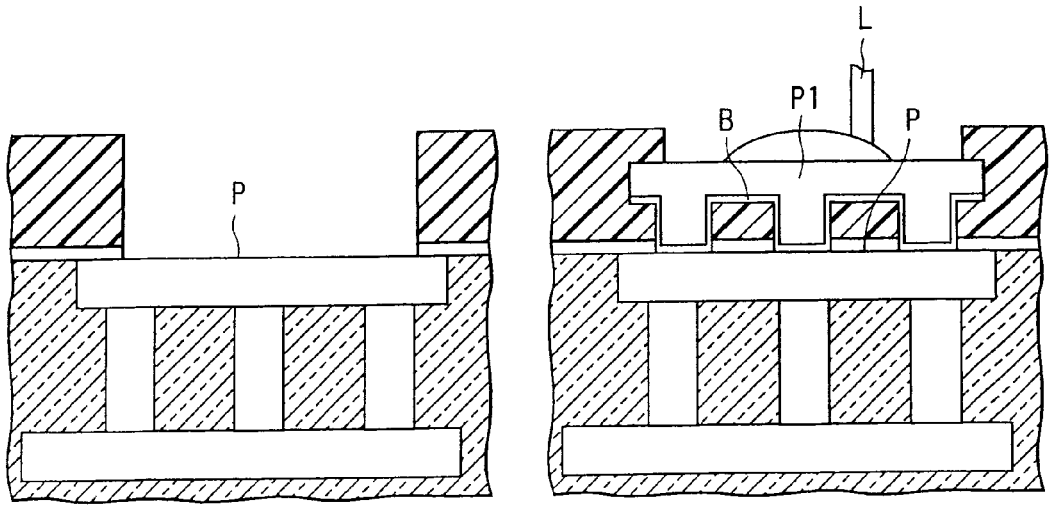
Figure 9A:
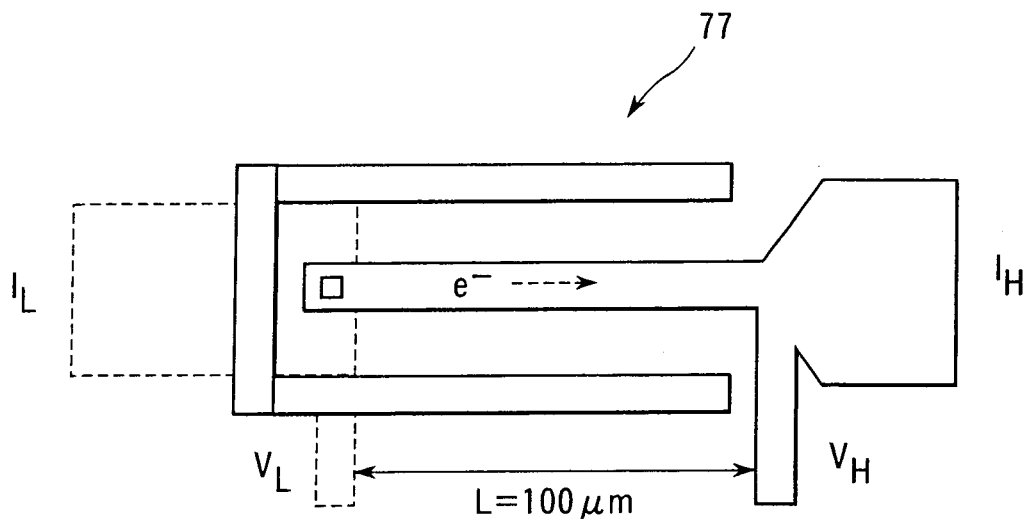
Figure 9B:
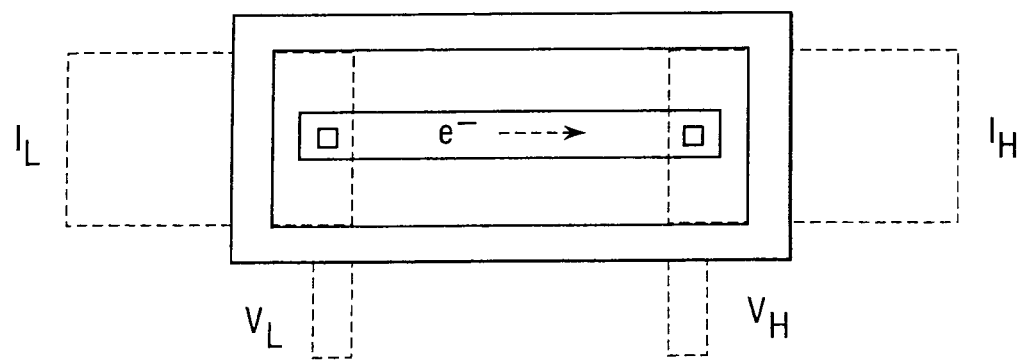
Figure 10:
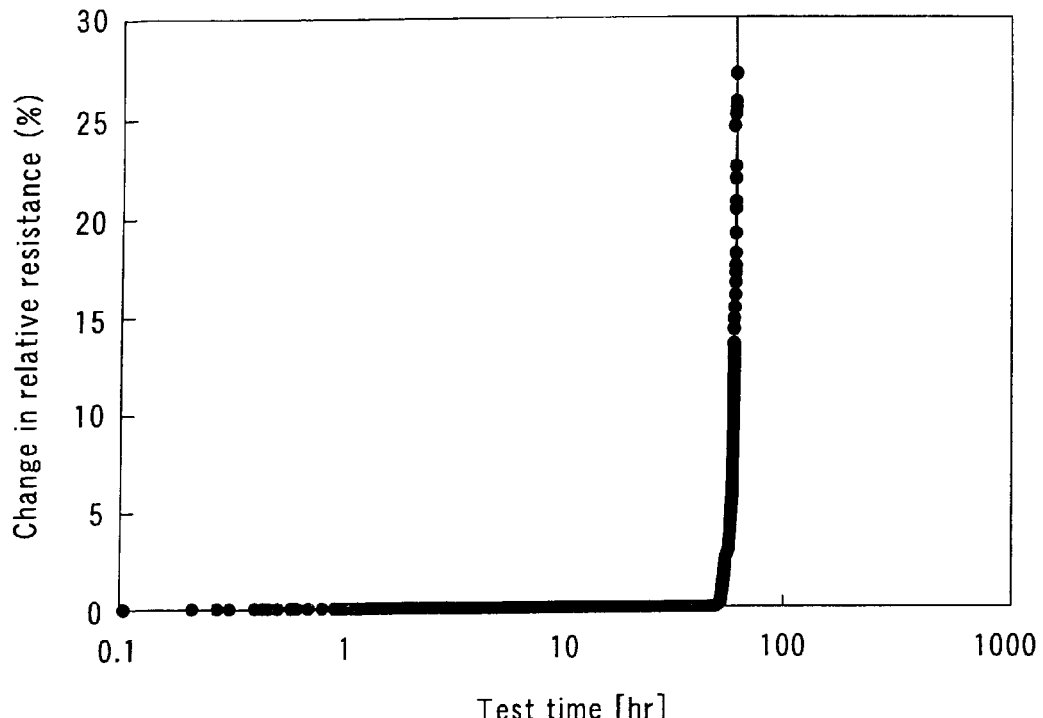
Figure 11:
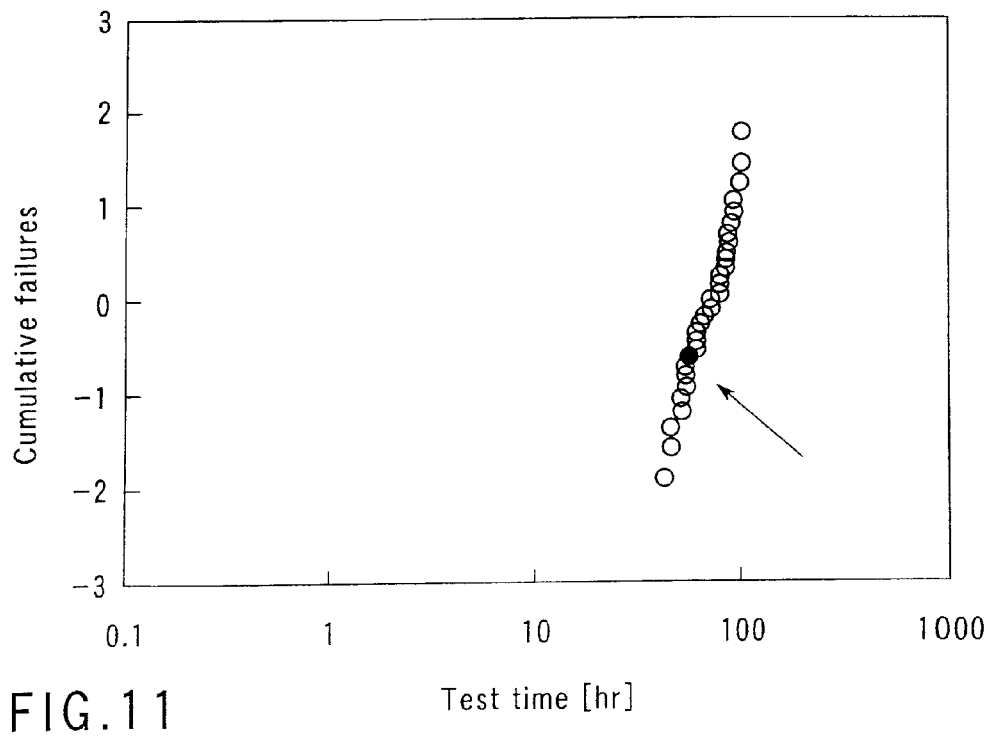
Figure 12:
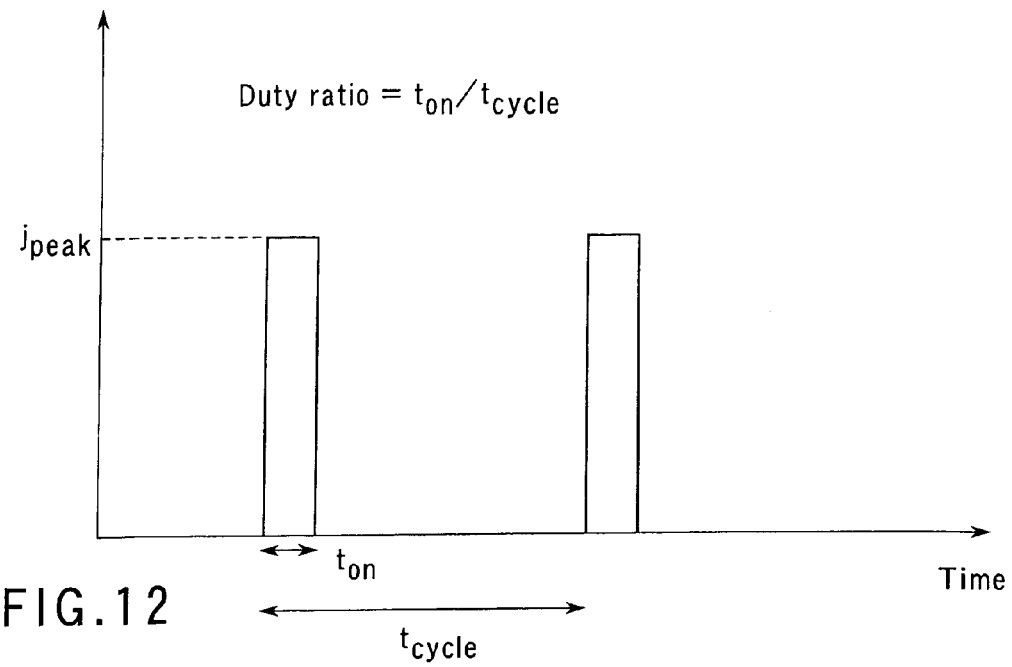
Figure 13:
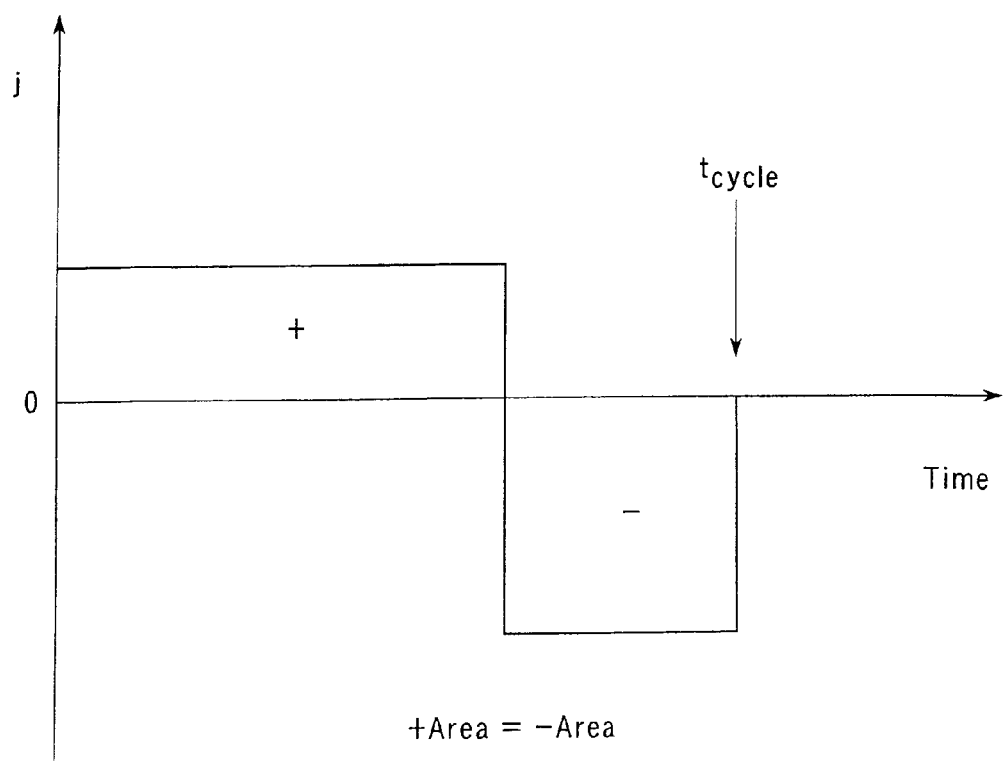
Figure 14C:
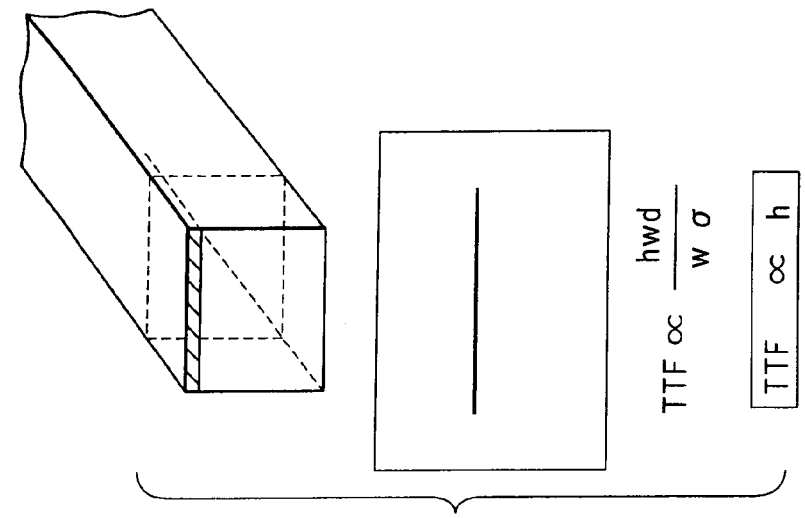
Figure 14B:
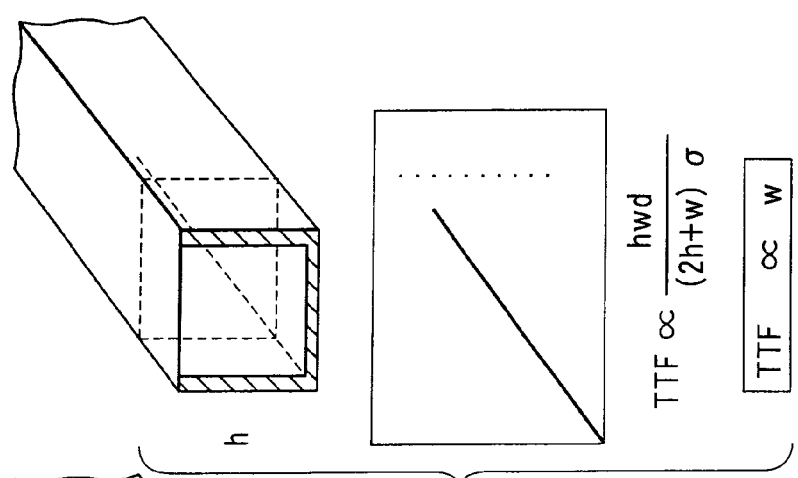
Figure 14A:
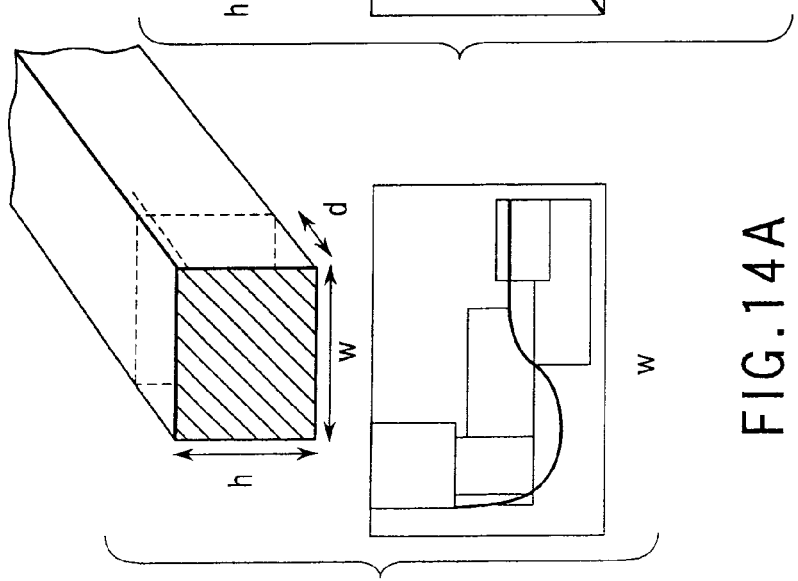
Figure 15B:
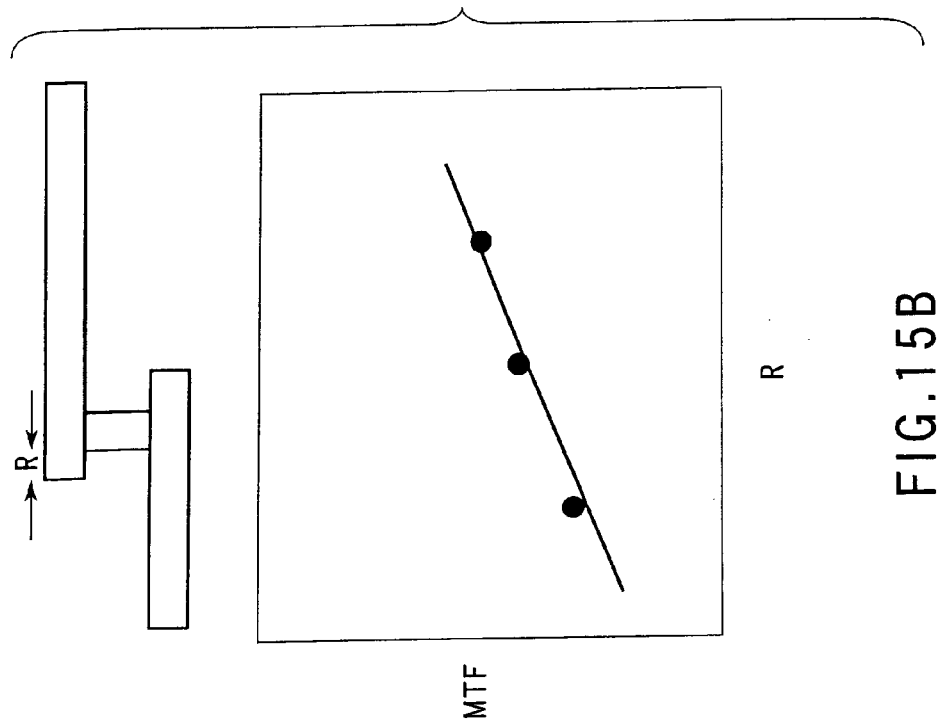
Figure 15A:
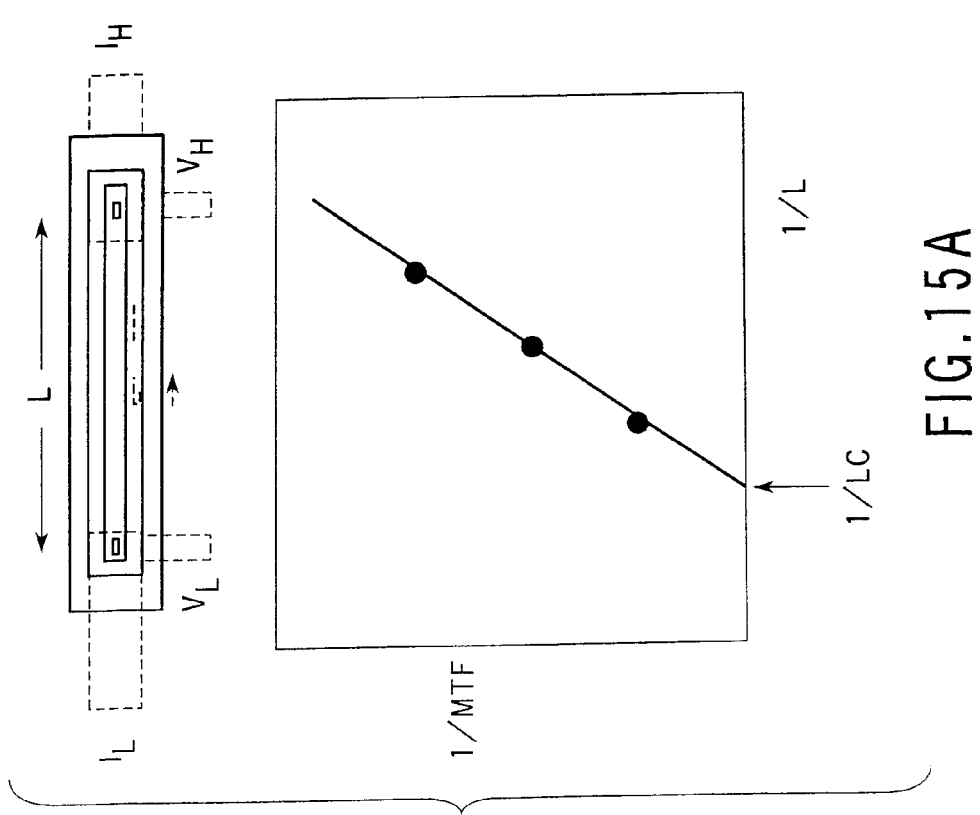
Figure 16:
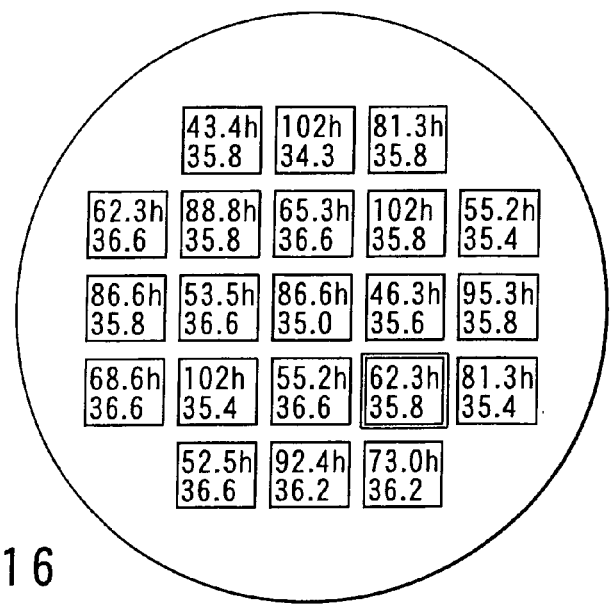
Figure 17:
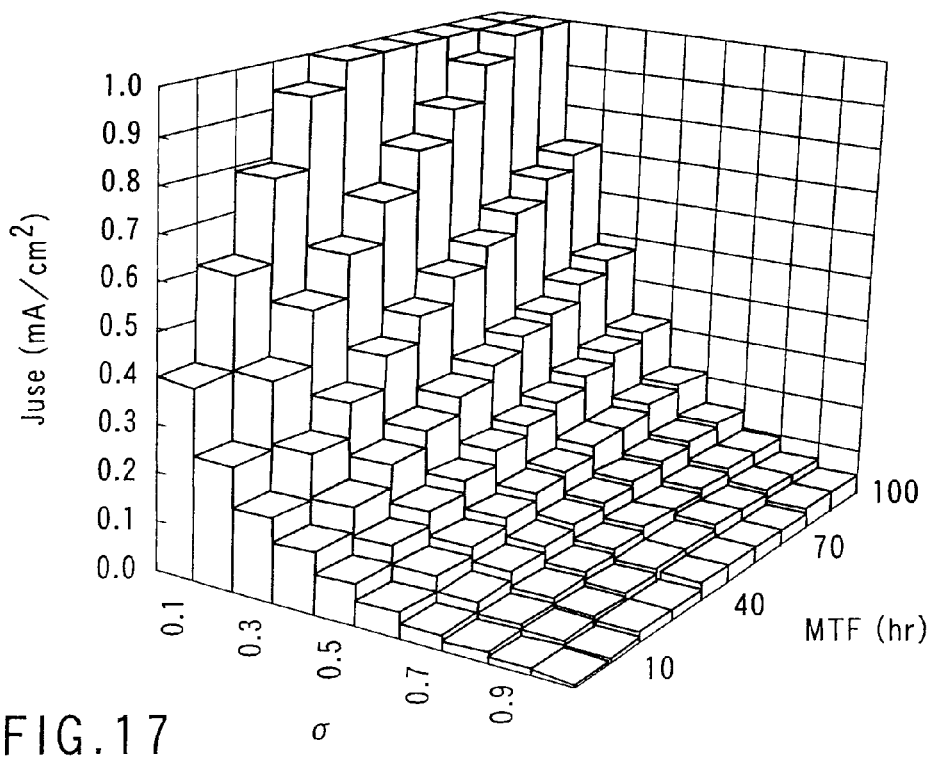
Figure 18A:
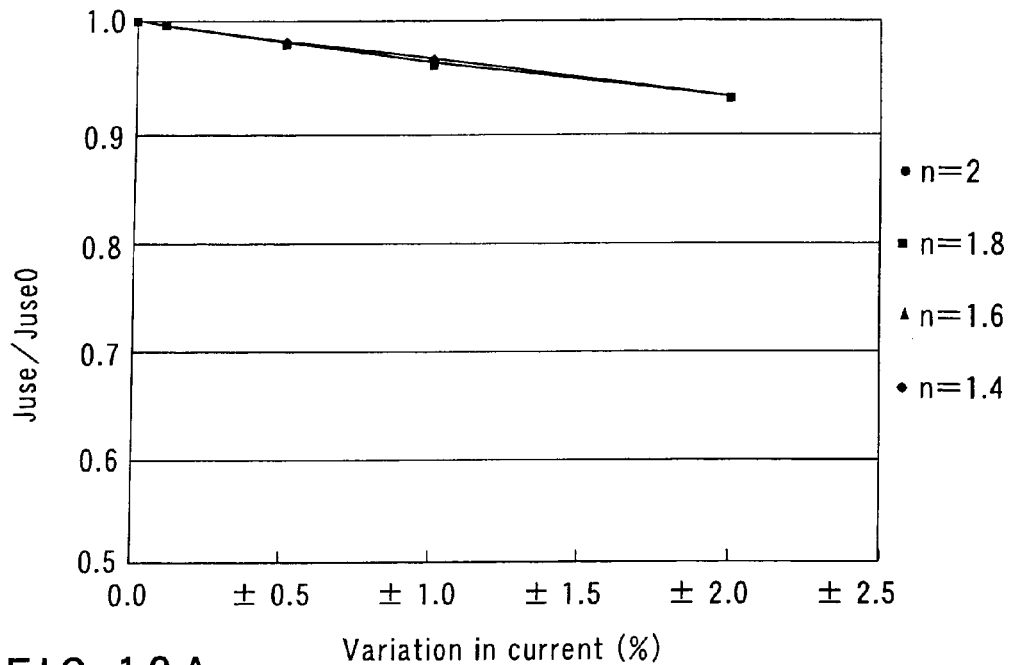
Figure 18B:
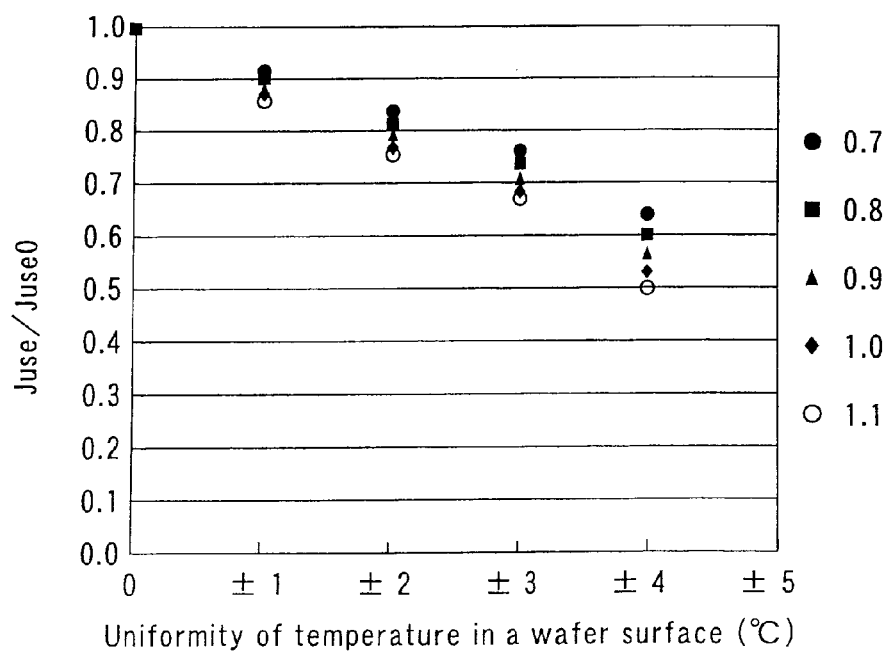
Figure 19A:
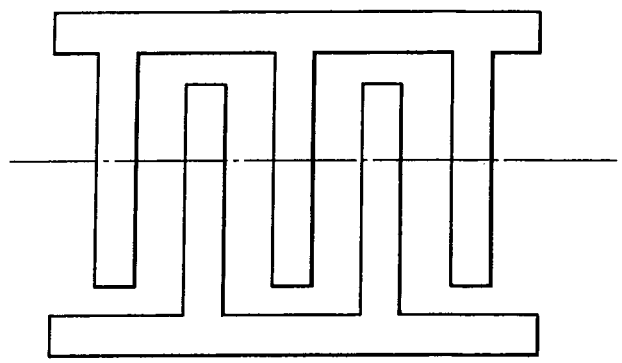
Figure 19B:
Figure 19C:
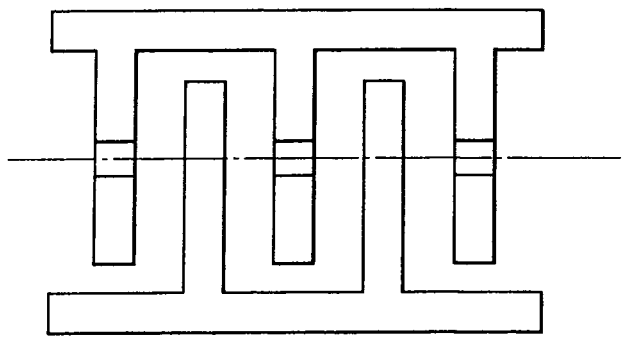
Figure 19D:
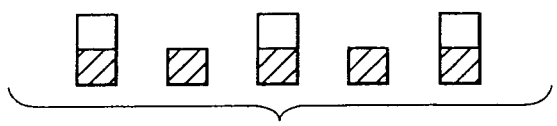

FIG. 8A is an enlarged sectional view showing an electrode pad portion in copper interconnections of a wafer, which is used in the reliability evaluation test method according to the present invention, and FIG. 8B is an enlarged sectional view showing an electrode pad portion in copper interconnections of a wafer, which is used in a conventional reliability evaluation test method executed using a furnace;

FIGS. 9A and 9B are plan views showing test patterns on a wafer, which are to be used for an electromigration test, in which FIG. 9A is a view showing a single terminal type, and FIG. 9B is a view showing a double terminal type;

FIG. 10 is a graph showing the relationship between a change in relative resistance and a test time during the electromigration test;

FIG. 11 is a graph showing cumulative failures by the electromigration test;

FIG. 12 is a chart showing the waveform of a current that is supplied in an electromigration test using a pulse DC current;

FIG. 13 is a chart showing the waveform of an AC current that is supplied in an electromigration test using an AC current;

FIGS. 14A to 14C are views each showing the relationship between a main diffusion path and MTF;

FIG. 15A is a graph showing a critical length measurement result, and FIG. 15B is a graph showing the Reservoir length dependence of MTF;

FIG. 16 is a view showing the distribution of TTF and initial resistance in a wafer;

FIG. 17 is a graph showing the influence of MTF and σ on Juse;

FIG. 18A is a graph showing a Juse loss due to a current variation, and FIG. 18B is a graph showing a Juse loss due to the temperature distribution;

FIGS. 19A to 19D are views showing examples of test patterns used in a BT test (TDDB test), in which FIG. 19A is a plan view showing an upper level interconnection pattern, FIG. 19B is a sectional view of FIG. 19A, FIG. 19C is a plan view showing a lower level interconnection pattern, and FIG. 19D is a sectional view of FIG. 19C;

FIGS. 20A to 20E are views showing steps in manufacturing the contactor according to the embodiment;

FIGS. 21A to 21D are views showing steps in manufacturing the contactor, which follow the steps shown in FIGS. 20A to 20E; and FIGS. 22A to 22D are views showing steps in manufacturing the contactor, which follow the steps shown in FIGS. 21A to 21D.

DETAILED DESCRIPTION OF THE INVENTION

The present invention will be described below on the basis of embodiments shown in FIGS. 1A to 22D. A reliability evaluation test system according to the embodiment comprises a reliability evaluation test apparatus 10 and an aligner 50. The reliability evaluation test apparatus 10 and aligner 50 can be connected through a communication network so that data communication can be executed. The reliability evaluation test apparatus 10 according to the embodiment will be described first, and then, the aligner 50 will be described.

Figure 1A:
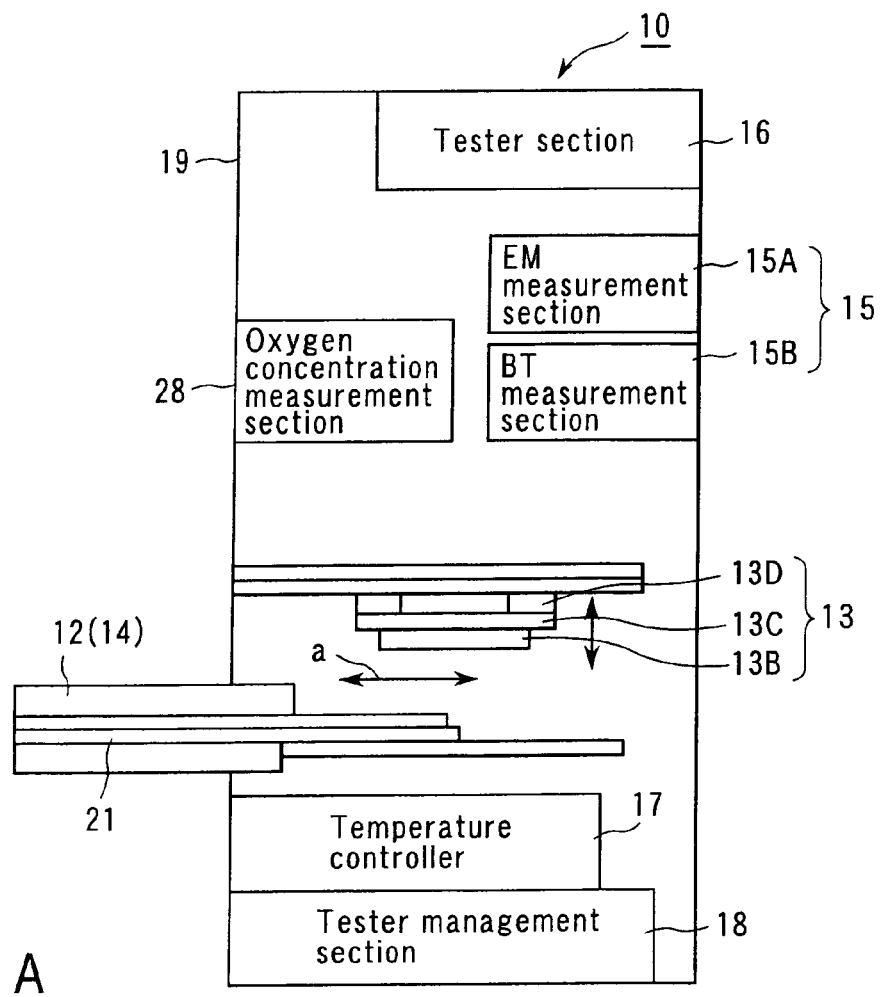
Figure 1B:
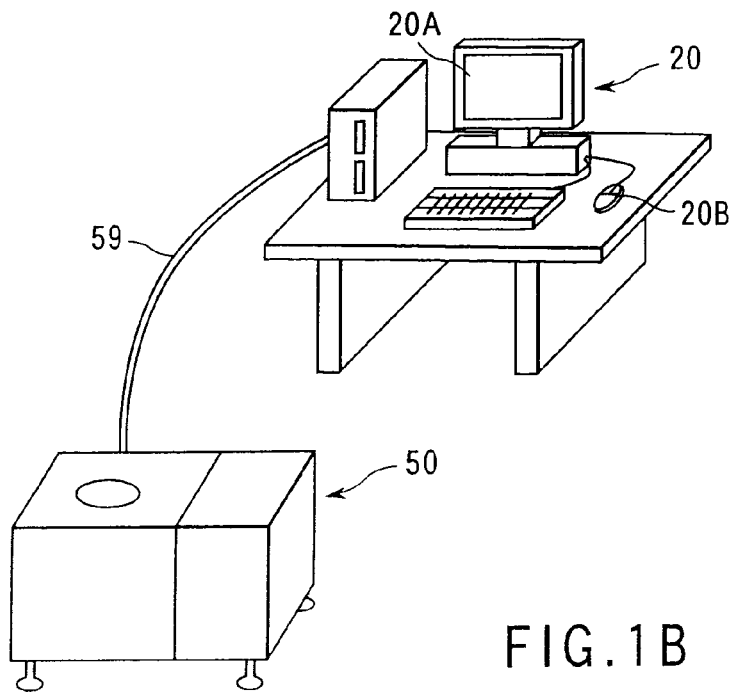
Figure 2:
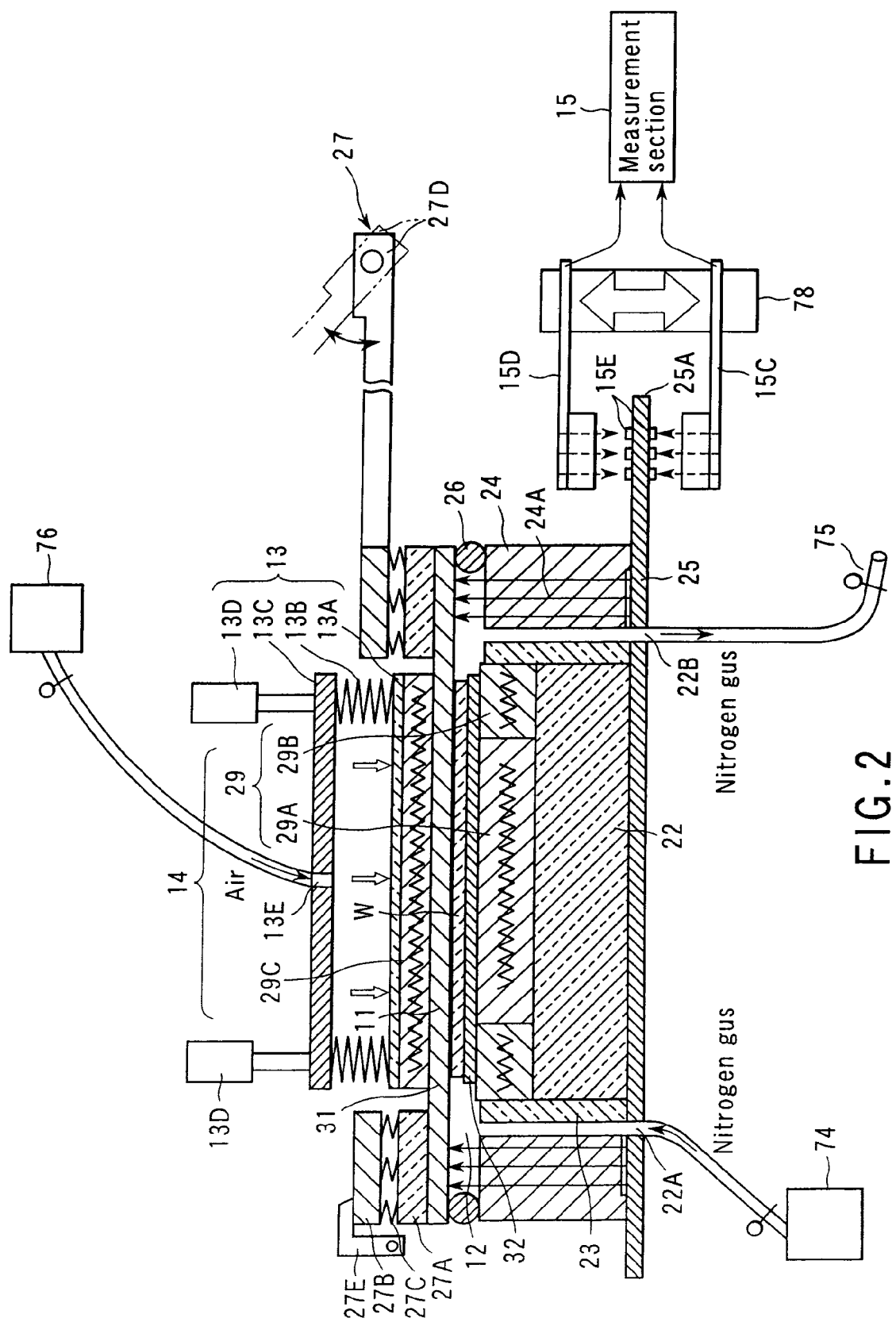
FIG. 2 is a sectional view showing the main part in a state wherein a wafer reliability evaluation test is executed using the reliability evaluation test apparatus shown in FIG. 1.
Figure 3A:
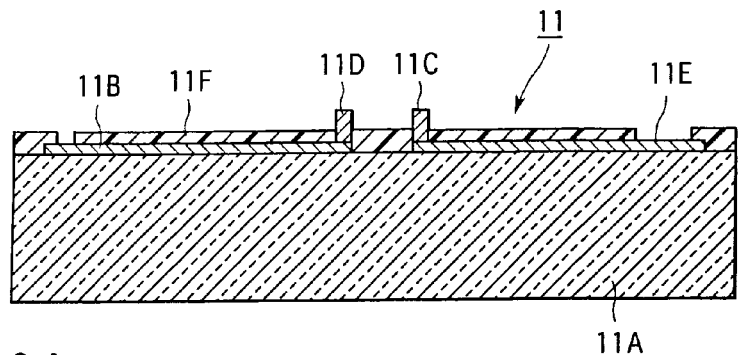
Figure 3B:
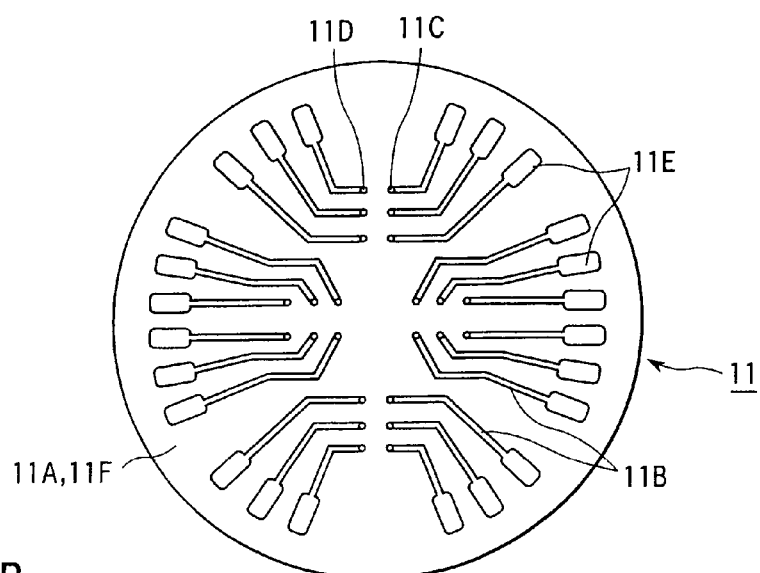

As shown in FIGS. 1A, 1B, and 2, the reliability evaluation test apparatus 10 according to this embodiment comprises a wafer storage section 12, pressure mechanism 13, heating mechanism 14 (FIG. 2), measurement section 15, tester section 16, temperature controller 17, tester management section 18, housing 19, and controller 20 (FIG. 1B). The wafer storage section 12 stores a wafer that is totally in electrical contact with a contactor 11 (to be described later) (FIGS. 3A and 3B). The pressure mechanism 13 is arranged above the wafer storage section 12 to press the contactor 11. The heating mechanism 14 directly heats a wafer that is pressed against the contactor 11 by the pressure mechanism 13. The measurement section 15 measures the electrical characteristics of the wafer heated by the heating mechanism 14. The tester section 16 forms a measurement signal of the measurement section 15 and processes a measurement result signal. The temperature controller 17 controls the temperature of the wafer. The tester management section 18 manages the tester section 16. The housing 19 accommodates the above devices. The controller 20 controls the devices in the housing 19. The reliability evaluation test apparatus 10 evaluates the reliability of interconnection films and insulating films formed on the semiconductor wafer under accelerated conditions of the temperature, current density, and the like. As shown in FIG. 1B, the controller 20 can be constituted by a desktop computer and arranged adjacent to the housing 19. For example, a test result is displayed on a monitor screen 20A of the computer as a wafer map (FIG. 16). When any one of the device on the wafer map is clicked on by a mouse 20B or the like, the test result of the device on the wafer can be immediately displayed on the monitor screen 20A. The controller 20 also has a data communication function with the aligner (to be described later) so that the result of the reliability evaluation test can be transmitted to the aligner. The wafer storage section 12 can be inserted/extracted the wafer into/from the housing 19 in the direction of an arrow a in FIG. 1A through a slide mechanism 21. The measurement section 15 may be constituted by, e.g., an electromigration (EM) measurement section 15A and a leakage current (BT) measurement section 15B. The tester section 16 is constituted in correspondence with these measurement sections 15A and 15B. FIG. 2 shows an example of the main part of the structure of the reliability evaluation test apparatus 10. The measurement section may also comprise a measurement section for another test item.

For example, as shown in FIG. 2, the wafer storage section 12 may comprise a table 22, thermal insulating mechanism (cylinder) 23, heat-resistant connection ring 24, and wiring board 25. The table 22 is made of a thermal insulating & electrically insulating material. A wafer W that is totally in electrical contact with the contactor 11 may be mounted on the table 22 through heaters 29A and 29B (to be described later). The thermal insulating mechanism 23 is made of a thermal insulating & electrically insulating material and surrounds the table 22. The heat-resistant connection ring 24 comes into electrical contact with the contactor 11 through heat-resistant contact terminals (e.g., pogopins) 24A. The wiring board 25 comes into electrical contact with the connection ring 24 and receives a test signal from the measurement section 15. The wafer storage section 12 can reliably cause the pressure mechanism 13 to totally bring the contactor 11 into electrical contact with the wafer W. The contactor 11 can be electrically connected to the measurement section 15 through the connection ring 24 and wiring board 25.

As shown in FIG. 2, a seal ring 26 made of a heat-resistant resin such as silicone rubber may be arranged at the outer edge of the connection ring 24. When the seal ring 26 elastically comes into contact with the contactor 11, a hermetic space is formed in the wafer storage section 12. The wafer storage section 12 may also comprise a press mechanism 27 which presses the outer edge portion of the contactor 11. The press mechanism 27 reliably brings the contactor 11 into electrical contact with the connection ring 24. The press mechanism 27 may be made of, e.g., a heat-resistant material (e.g., ceramic) and comprise a first ring-shaped member 27A, second ring-shaped member 27B, heat-resistant spring member 27C, arm 27D, and a pair of gas springs (not shown). The first ring-shaped member 27A has a shape complying with that of the outer edge portion of the contactor 11. The second ring-shaped member 27B is formed into almost the same size as that of the first ring-shaped member 27A. The heat-resistant spring member 27C is inserted between the first and second ring-shaped members 27A and 27B. The arm 27D is formed integrally with the second ring-shaped member 27B and connected, at the rear portion of the wafer storage section 12, to the wafer storage section 12 through a hinge. The pair of gas springs support the arm 27D. By the function of the gas springs, the first and second ring-shaped members 27A and 27B can be opened/closed with little force. The press mechanism 27 may have a lock mechanism 27E. The lock mechanism 27E fixes the first and second ring-shaped members 27A and 27B to the outer edge portion of the contactor 11. Hence, the wafer storage section 12 stores the contactor 11 and wafer W, which are integrated. Since the pressure mechanism 13 and press mechanism 27 press the contactor 11, the interior of the wafer storage section 12 is thermally insulated from the external atmosphere so that the hermetic state is maintained.

For example, as shown in FIG. 2, the table 22 may have a pair of gas supply and exhaust ports 22A and 22B which vertically extend through the table 22. An inert gas such as nitrogen gas and/or a reducing gas such as hydrogen gas is supplied from an inert gas supply apparatus 74 through the gas supply port 22A. Accordingly, an inert gas atmosphere or a reducing gas atmosphere is created in the considerably limited minimum space corresponding to the contact portion between the contactor 11 and the wafer W in the wafer storage section 12. The exhaust port 22B exhausts the inert gas and/or the reducing gas through a valve 75. Supply of a reducing gas may be preferably executed by adding a reducing gas in a predetermined amount to an inert gas. When an inert gas atmosphere and/or a reducing gas atmosphere is formed in the small space in the wafer storage section 12, metal interconnections such as copper interconnections that are formed on the wafer W and readily oxidize may be prevented from oxidizing under a higher temperature, or metal oxide films may be reduced. In addition, the supply amount of the inert gas and/or the reducing gas can be suppressed to minimum. The wafer storage section 12 has a hermetic structure. Hence, when the air is replaced with an inert gas and/or a reducing gas, the oxygen concentration can be reduced to, e.g., 10 ppm or less and, more particularly, 1 to 5 ppm or less to prevent oxidation of metal interconnections or pads formed from, e.g., copper. The oxygen concentration is detected by a conventionally known oxygen sensor (not shown) arranged in the wafer storage section 12. On the basis of the detected signal, an oxygen concentration measurement section 28 (FIG. 1) arranged in the housing 19 calculates the oxygen concentration. Hence, no anti-oxidizing aluminum pad layer need to be formed on a test pad, unlike the prior art. When the air is replaced with a reducing gas, any metal oxide film has been formed before the test may be reduced. For this reason, the wafer W and contactor 11 can be reliably electrically connected.

As shown in FIG. 1, the pressure mechanism 13 is fixed immediately above the wafer storage section 12 inserted into the housing 19. As shown in FIGS. 1 and 2, the pressure mechanism 13 may comprise a pressure plate 13A that presses the contactor 11, a bellows 13B which is made of a metal and whose lower end is connected to the upper surface of the pressure plate 13A, a support plate 13C which is connected to the upper end of the bellows 13B to support the bellows 13B, and a cylinder mechanism 13D which is connected to the support plate 13C and fixed while being suspended in the housing 19. As shown in FIG. 2, the support plate 13C may have a through hole 13E. A gas supply mechanism 76 supplies compressed air from the through hole 13E to increase the pressure in a space formed by the pressure plate 13A, bellows 13B, and support plate 13C. Upon pressurizing, the bellows 13B extends downward from the support plate 13C supported by the cylinder mechanism 13D to press the contactor 11 through the pressure plate 13A. Accordingly, the entire surface of the contactor 11 is uniformly pressed so that bumps of the contactor 11 reliably totally come into contact with electrode pads of the wafer W. As shown in FIG. 2, an auxiliary heater 29C (to be described later) can be fixed at the center on the lower surface of the pressure plate 13A. The auxiliary heater 29C heats the wafer W from the contactor 11 side. As described above, the press mechanism 27 is connected through a hinge at the rear portion of the wafer storage section 12 and can freely be opened/closed through an auxiliary mechanism such as gas springs. After the contactor 11 and wafer W, which are integrated, are placed in the wafer storage section 12, the press mechanism 27 is tilted forward to horizontally contact the second ring-shaped member 27B to the outer edge of the contactor 11 in the wafer storage section 12. As a result, as shown in FIG. 2, the outer edge portion of the contactor 11 stored in the wafer storage section 12 is pressed by the second ring-shaped member 27B and lock mechanism 27E.

The heating mechanism 14 may have a heater 29 which heats the wafer W placed on the table 22 from the lower surface side. The heater 29 uniformly heats the entire surface of the wafer W. The heater 29 may be formed from, e.g., the first heater 29A which has a circular shape and is arranged at the central portion of the table 22 and the second heater 29B which has a ring shape and surrounds the first heater 29A. The first heater 29A heats the central portion of the wafer W. The second heater 29B heats the outer portion of the wafer W. The second heater 29B can also compensate for a dissipated heat component from the outer edge portion of the wafer W. The heater 29 may have any structure as long as it can uniformly heat the entire surface of the wafer W. The heater 29 need not always be divided into the first heater 29A and second heater 29B. In addition to the heater 29, the heating mechanism 14 may also have the disk-shaped auxiliary heater 29C that comes into contact with the upper surface of the contactor 11. The auxiliary heater 29C more reliably heats the wafer W to a predetermined high temperature in cooperation with the heater 29 and maintains the temperature. As described above, the heating mechanism 14 directly heats the wafer W from the upper and lower surfaces. Since the heating space to be heated by the heating mechanism 14 is considerably limited, the wafer W can be heated to a target temperature in a short time. In addition, when the wafer W is heated and maintained at 160° C. or more and, more particularly, at a highest temperature of 350° C., the electromigration and leakage current of the metal interconnections on the wafer W can be accurately measured under the high temperature. The heating mechanism 14 preferably controls to uniformly heat the entire surface of the wafer W to 160° C. or more while setting a temperature distribution in the wafer within ±2.0° C. Hence, when, e.g., copper is used as the interconnection material, the interconnections and insulating films can be accurately evaluated by conducting the reliability evaluation test under accelerated conditions of the high temperature and high current density.

The wiring board 25 that constitutes the wafer storage section 12 extends to the rear side (right side of FIG. 2) of the housing 19. External connection terminals 15E are arranged on the upper and lower surfaces of an extended portion 25A. On the other hand, connection boards 15C and 15D of the EM measurement section 15A and BT measurement section 15B, respectively, shown in FIG. 1 are arranged to sandwich the extended portion 25A, as shown in FIG. 2. The connection boards 15C and 15D are alternately brought into electrical contact with the external connection terminals on the upper and lower surfaces of the extended portion 25A by a switching mechanism 78 to alternately switch between the EM measurement section 15A and the BT measurement section 15B. That is, the connection boards 15C and 15D are switched between the EM measurement section 15A and the BT measurement section 15B. Each of the measurement sections 15A and 15B may be formed from a board having 512 channels so that 512 devices can be simultaneously measured.

Figure 7A:
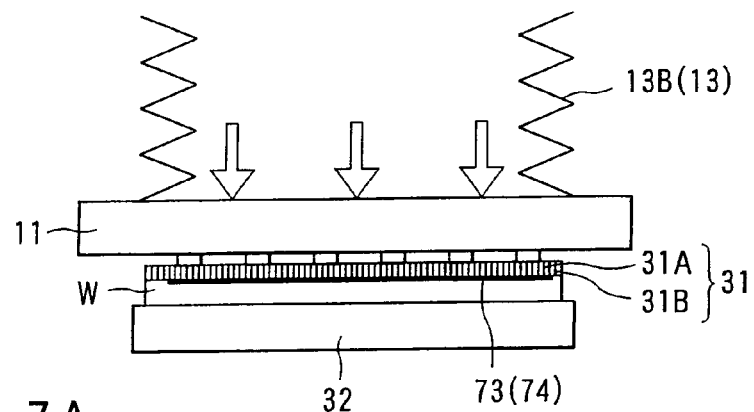
FIG. 7A is a schematic view showing a side surface in a state wherein the contactor and wafer totally come into contact through a pressure mechanism shown in FIG. 2.
Figure 7B:
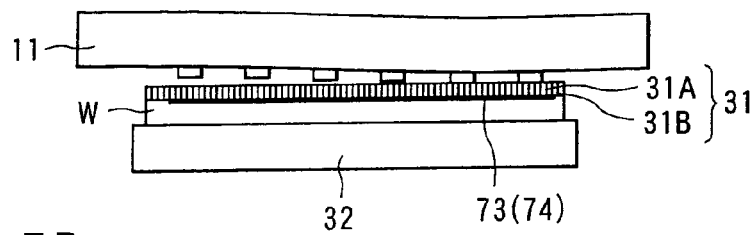
FIG. 7B is a side view exaggeratingly showing a state wherein the contactor bends.

The contactor 11 and wafer W can be totally brought into contact with each other through an anisotropic conductive film 31, as shown in FIG. 2. Each of the bumps of the contactor 11 and the electrode pads of the wafer W preferably has a circular shape or a polygonal shape, or a shape of a combination thereof. The maximum length of a bump in the pitch direction is preferably equal to or smaller than the pitch size of the electrode pads of the wafer. Each bump may be formed into a diameter of, e.g., about 75 μm. The bumps may be formed at an interval of about 120 μm with respect to the centers. On the other hand, the anisotropic conductive film 31 has an elastic structure so that even when the bumps of the contactor 11 and electrode pads of the wafer W have a level difference, it can be absorbed. The anisotropic conductive film 31 may be formed from a tetrafluoroethylene resin sheet 31A and aggregates 31B (each having a diameter of, e.g., 25 μm) of nickel fine particles which uniformly arranged in the entire surface at a predetermined interval (e.g., 70 μm) and extended through the tetrafluoroethylene resin sheet 31A, as shown in, e.g., FIGS. 7A and 7B. The aggregate 31B is formed by gathering metal fine particles. For this reason, when a pressure is applied to the aggregate 31B, the nickel fine particles are set in a compaction state. Hence, only by inserting the anisotropic conductive film 31 between the contactor 11 and the wafer W, the bumps of the contactor 11 and the electrode pads of the wafer W can be elastically totally brought into contact with each other through the anisotropic conductive film 31 so that both can reliably be electrically connected. The GoreMate is normally disposable. Referring to FIGS. 2, 7A, and 7B, reference numeral 32 denotes a wafer holder made of a magnetic material such as an iron-based material. To align the bumps of the contactor 11 and the electrode pads of the wafer W, an aligner to be described later may be used.

As shown in, e.g., FIGS. 3A and 3B, the contactor 11 may comprise a heat-resistant substrate 11A, conductor circuits 11B, a plurality of bumps 11C, connection pad portions 11D for the wafer W, another connection pad portions 11E for the test apparatus, and insulating coating 11F. The substrate 11A is formed from a material (to be described later). The conductor circuits 11B are formed on the upper surface of the heat-resistant substrate 11A by using a conductive metal (e.g., copper or a copper alloy). The plurality of bumps 11C are formed integrally with the conductor circuits 11B. The pad portions 11E come into electrical contact with the pogopins 24A arranged on the connection ring 24 of the reliability evaluation test apparatus 10. The insulating coating 11F covers portions except the connection pad portions 11D and connection pad portions 11E. The contactor 11 can suitably be used for a reliability evaluation test executed at a temperature of 160° C. or more.

Figure 4:
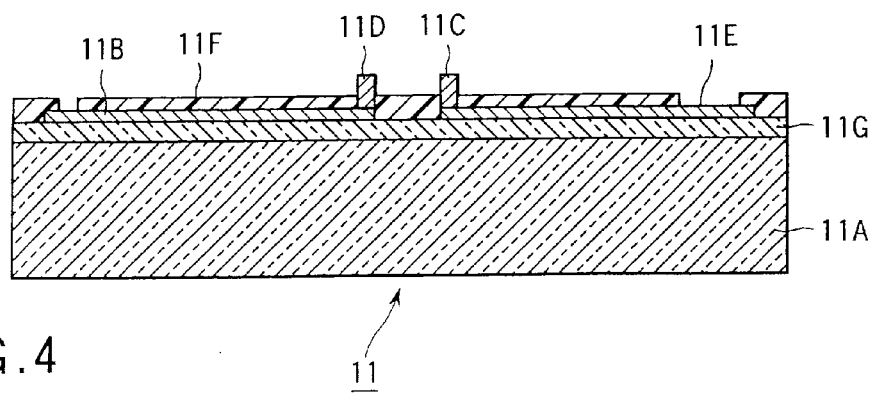
FIG. 4 is a sectional view showing a contactor according to another embodiment of the present invention.

The insulating coating 11F prevents any unnecessary electrical contact between the contactor 11 and the wafer W. Hence, stable electrical connection between the contactor 11 and the wafer W can be ensured. The heat-resistant substrate 11A is preferably made of a material whose thermal expansion coefficient under a high temperature is very small, e.g., a material whose thermal expansion coefficient in the planar direction of the contactor 11 under a temperature of 160° C. or more is 1 to 50 ppm/° C., and preferably, 2 to 30 ppm/° C. Even under a high temperature of 160° C. or more, and for example, at 350° C., the thermal expansion coefficient of the heat-resistant substrate 11A and that of the wafer W have little difference. Hence, the total contact state can be maintained, the electrical connection can be reliably ensured, and the reliability evaluation test can be reliably executed. The heat-resistant substrate 11A may be made of at least one material selected from, e.g., a heat-resistant resin such as polyimide or bismaleimide-triazine, a heat-resistant resin with a reinforcement material (e.g., glass cloth or carbon fiber), a metal such as aluminum, copper, stainless steel, an invar alloy, or invar, a conductor such as silicon, and a ceramic mainly containing aluminum nitride or silicon carbide. When two or more materials are used, the heat-resistant substrate 11A can be formed by appropriately combining the materials. The material of the insulating coating 11F is not particularly limited. For example, a heat-resistant resin such as a polyimide-based resin is preferably used. The insulating coating 11F only needs to be formed on a surface except electrical connection portions for a reliability evaluation test. As shown in FIG. 4, an insulating layer 11G such as a silicon oxide film may be formed on the surface in accordance with the type of the heat-resistant substrate 11A.

The controller 20 can display the test result of the wafer W on the display apparatus as a wafer map (FIG. 16). The controller 20 can also transmit the test result to the aligner 50 through a data communication line.

Figure 5A:
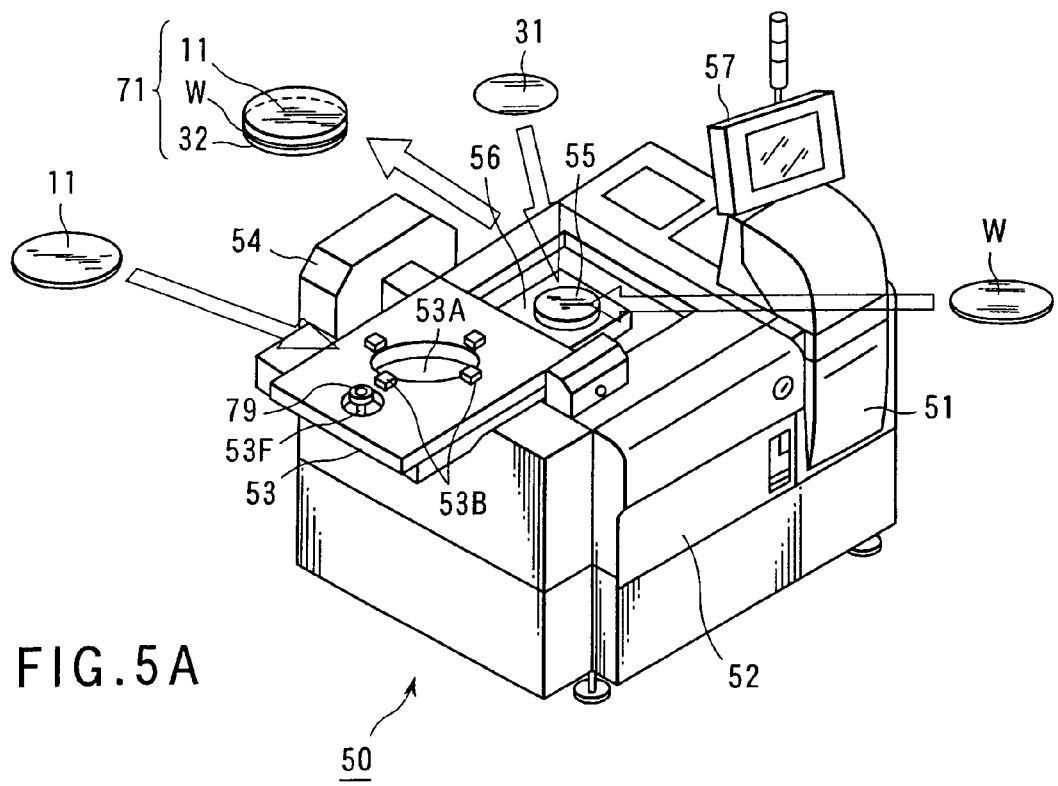
Figure 5B:
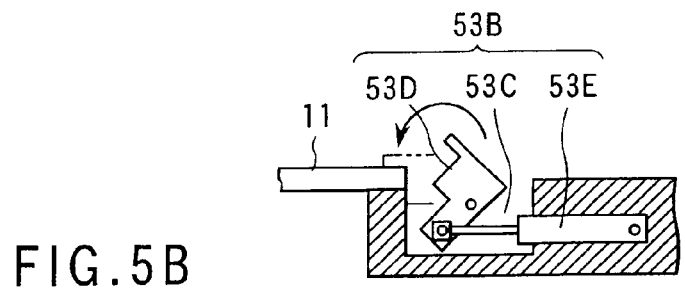

The aligner has an arrangement as shown in, e.g., FIGS. 5A and 5. As shown in FIG. 5A, the aligner 50 comprises a loader chamber 51 which stores the wafer W and loads/unloads the wafer W, and an alignment chamber 52 which is arranged adjacent to the loader chamber 51 to align the wafer W and contactor 11. In the alignment chamber, the wafer W and contactor 11 are aligned to be totally brought into contact with each other. Although not illustrated, a transfer mechanism (tweezers) and prealignment mechanism (subchuck) are arranged in the loader chamber 51. The wafers W are transferred from the carrier one by one through the tweezers. In this transfer process, the wafer W is prealigned on the subchuck using an orientation flat or notch as a reference. After that, the wafer W is transferred to the alignment chamber 52 through the tweezers.

As shown in FIG. 5A, a head plate 53 is attached to the alignment chamber 52 to be freely opened/closed. An open/close driving mechanism 54 moves the head plate 53 having the contactor 11 to open/close the upper opening of the alignment chamber 52. A first opening portion 53A having a smaller diameter than the contactor 11 is formed at the center of the head plate 53. Four fixing mechanisms 53B which fix the contactor 11 are arranged on the inner surface of the head plate 53 (in FIG. 5A, the head plate 53 is opened downside up) to surround the first opening portion 53A, As shown in, e.g., FIG. 5B, each fixing mechanism 53B comprises a press member 53D which is pivotally mounted in a recess portion 53C formed at a corresponding one of four portions around the first opening portion 53A, and an air cylinder 53E connected to the proximal portion of the press member 53D. The air cylinder 53E rotates the press member 53D in counterclockwise to fix the contactor 11 placed on the first opening portion 53A to the head plate 53.

As shown in FIG. 5A, a main chuck 55 which can move in the X, Y, Z, and θ directions is arranged under the head plate 53 in the alignment chamber 52. The wafer W is placed on the main chuck 55 through the wafer holder 32. The main chuck 55 moves in the X and Y directions through an X-Y stage 56. The main chuck 55 incorporates a rotary elevating mechanism (not shown). The rotary elevating mechanism vertically moves the main chuck on the X-Y stage 56 and also rotates the main chuck forward or backward in the θ direction. The tweezers in the loader chamber 51 move the prealigned wafer W onto the wafer holder 32 which is mounted on the main chuck 55 in the alignment chamber 52 in advance. The wafer holder may be made of a magnetic material such as an iron-based alloy. The wafer holder 32 is used to transfer the wafer W and contactor 11 which are integrated by a wafer transfer tool (to be described later).

An alignment mechanism (not shown) may be arranged in the alignment chamber 52. The alignment mechanism has an upper camera fixed on an alignment bridge and a lower camera fixed on the main chuck 55 side. Images sensed by these cameras are displayed on a display apparatus 57. A touch panel is also displayed on the display screen of the display apparatus 57 so that the aligner can be operated on the screen. The main chuck 55 is moved, and electrode pads on the wafer W are sensed by the upper camera. At the same time, the main chuck 55 is moved, and the bumps (FIG. 3) of the contactor 11 attached to the head plate 53 are sensed by the lower camera. On the basis of this image data, the electrode pads on the wafer W and the bumps of the contactor 11 are aligned. As the alignment mechanism, a technique proposed in, e.g., Jpn. Pat. Appln. KOKAI Publication No. 11-238767 may be used. The open/close driving mechanism 54 is preferably designed to accurately totally bring the contactor 11 and wafer W in contact whenever the open/close operation of the head plate 53 after alignment is conducted repeatedly.

A reliability evaluation test result transmitted by data communication with the reliability evaluation test apparatus 10 can be displayed on the display screen of the display apparatus 57 as a wafer map (FIG. 16). The test result is displayed as numerical values on the wafer map. Defective portions and their states after the test can be selected through the wafer map, and the defective devices can be observed with a microscope 79. More specifically, a second opening portion 53F adjacent to the first opening portion 53A is formed in the head plate 53. The microscope (having a maximum magnification of, e.g., 2000× or more) is attached to the surface of the second opening portion 53F. Each device of the wafer W placed on the main chuck 55 can be observed through the microscope. Hence, after the wafer W tested by the reliability evaluation test apparatus 10 is placed on the main chuck 55 of the aligner 50, the test result from the reliability evaluation test apparatus 10 is transmitted to the aligner 50 through a communication line. The test result is displayed on the display screen of the display apparatus 57 as a wafer map. A device used for the test can be selected on the screen. This tested device is moved to a position immediately under the microscope by operating the main chuck 55. A void or the like due to the electromigration phenomenon can be observed using the microscope in the wafer state. When a CCD camera with a lens is used as the microscope, each device on the wafer W can be observed on the display apparatus 57.

Figure 6:
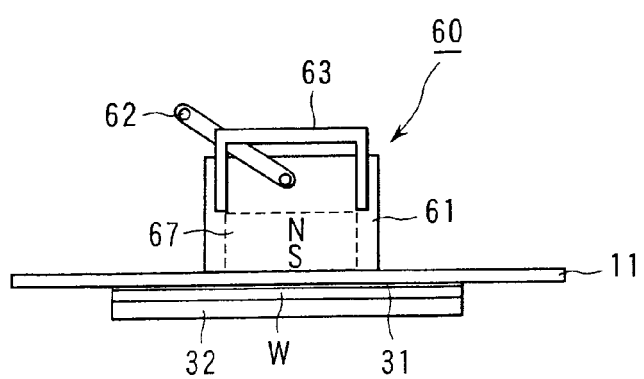
FIG. 6 is a side view showing a state wherein a shell is chucked using a wafer transfer tool.

The wafer W and contactor 11 which are totally brought into contact by the aligner 50 in the above way are transferred to the reliability evaluation test apparatus 10 by a wafer transfer tool 60. The wafer transfer tool 60 comprises a magnetic circuit 67 arranged in a case 61, an operation lever 62 pivotally mounted on the case 61 to open/close the magnetic circuit, and a pair of handles 63 attached to the case on the left and right sides of the operation lever 62, as shown in, e.g., FIG. 6. A magnet may be used in place of the magnetic circuit. In this case, the magnet may be moved in the vertical direction by the operation lever 62. When handle operation is performed in a state wherein the wafer transfer tool is placed from the first opening portion 53A of the head plate 53 (FIG. 5A) onto the contactor 11, the magnetic circuit 77 is excited. The magnetic circuit strongly attracts the wafer holder 32 so that the contactor 11, anisotropic conductive film 31, and wafer W are integrated without any misalignment, as shown in FIG. 6.

An embodiment of the reliability evaluation test method of the present invention will be described next together with the operation of the reliability evaluation test system with reference to FIGS. 5A to 17. First, the probes (e.g., bumps) of the contactor 11 and the electrode pads on the wafer W are aligned using the aligner 50. To do this, the head plate 53 is opened by the open/close driving mechanism 54. The contactor 11 is attached from the inner surface side of the head plate 53 to the first opening portion 53A through the fixing mechanisms 53B. Simultaneously, the wafer holder 32 is placed on the main chuck 55. Next, the head plate 53 is closed by the open/close driving mechanism 54. Then, the wafer W is prealigned using the tweezers and subchuck in the loader chamber 51 and placed on the wafer holder 32 by the tweezers. Subsequently, the electrode pads on the wafer W and the bumps of the contactor 11 are aligned using the X-Y stage 56, rotary elevating mechanism, and alignment mechanism. After the end of alignment, the head plate 53 is opened. The anisotropic conductive film 31 may be arranged on the wafer W after alignment. The head plate 53 closes the opening portion of the alignment chamber 52 by the open/close driving mechanism 54. When the main chuck 55 moves upward to totally bring the bumps of the contactor 11 and the electrode pads of the wafer W into contact through the anisotropic conductive film 31, an integrated shell 71 including the wafer holder 32 is formed.

After that, when the operator places the wafer transfer tool 60 from the first opening portion 53A of the head plate 53 onto the contactor 11 and operates the operation lever 62 of the wafer transfer tool 60 to excite the magnetic circuit, the wafer holder 32 is attracted from the contactor 11 side by a strong magnetic force so that the contactor 11, anisotropic conductive film 31, wafer W, and wafer holder 32 are integrally fixed without any misalignment. The head plate 53 is opened by releasing the fixing mechanisms 53B. After that, the wafer transfer tool 60 is detached from the main chuck 55 together with the shell 71, transferred to the reliability evaluation test apparatus 10, and mounted on the heater 29 of the wafer storage section 12 extracted from the housing 19 of the apparatus 10. Next, when the press mechanism 27 of the wafer storage section 12 is tilted by handle operation, the outer edge portion of the contactor 11 in the wafer storage section 12 is pressed against the seal ring 26 and fixed (FIG. 2). By this operation, the wafer W temporarily comes into contact with the heater 29 on the table 22 through the wafer holder 32. When the outer edge portion of the contactor 11 elastically comes into contact with the seal ring 26 on the connection ring 24, a hermetic state is formed. In addition, the contactor 11 elastically comes into contact with the pogopins 24A of the connection ring 24 so that the contactor 11 comes into electrical contact with the connection ring 24. Next, the operation lever 62 of the wafer transfer tool 60 is operated to degauss the magnetic circuit. The shell is released, the wafer transfer tool 60 is detached from the contactor 11, and the wafer storage section 12 is pressed into the housing 19.

After that, the controller 20 (FIG. 1B) drives the cylinder mechanism 13D of the pressure mechanism 13 and supplies compressed air into the bellows 13B through the through hole 13E. After this injection, the cylinder mechanism 13D moves the pressure plate 13A and bellows 13B downward. The auxiliary heater 29C on the lower surface of the pressure plate 13A is fitted inside the press mechanism 27. In a state wherein the pressure plate 13A has reached the lower end, the auxiliary heater 29C on the lower surface of the pressure plate 13A comes into contact with the contactor 11. At this time, as shown in FIG. 7A, the pressure of the pressurized air in the bellows 13B causes the pressure plate 13A to press the central portion of the contactor 11 through the auxiliary heater 29C, so that the contactor 11 is uniformly pressed against the entire surface of the wafer W.

The pressing force from the pressure plate 13A and press mechanism 27 totally brings the bumps 11C of the contactor 11 and the electrode pads formed on a multilayered interconnection 73 of the wafer W into electrical contact through the anisotropic conductive film 31. The multilayered interconnection 73 of the wafer W may be formed by a structure alternatively stacked with insulating films 74. At this time, as shown in FIG. 7B, the contactor 11 may be deformed and slightly undulate. The pressurized air in the bellows 13B corrects the deformation of the contactor 11 through the auxiliary heater 29C, as shown in FIGS. 7A and 2. With this correction and the anisotropic conductive film 31, all the bumps of the contactor 11 and all the electrode pads of the wafer W are totally brought into electrical contact with each other by a uniform pressing force. In the reliability evaluation test, 512 devices can be simultaneously measured. Hence, the test time can be greatly shortened as compared to the conventional method using a furnace.

In the above-described embodiment, when an inert gas is supplied from the gas supply port 22A into the wafer storage section 12 for a predetermined time (e.g., about 30 min), the air in the wafer storage section 12 is removed from the exhaust port 22B to set an inert gas atmosphere in the wafer storage section 12. The oxygen concentration is decreased to 10 ppm or less and, more specifically, 1 to 5 ppm or less. At this oxygen concentration, oxidation of the electrode pads and metal interconnections of the wafer W may be reliably prevented. For this reason, the electrode pads and metal interconnections may be formed by, e.g., copper or a copper alloy that readily oxidizes. For example, as shown in FIG. 8, when a pad P made of copper or a copper alloy, which is recently used, is formed on the wafer W and left to stand for a long time until the test, an oxide film is formed on the surface of the pad P. The oxide film makes electrical connection difficult. Even in this case, when an inert gas such as nitrogen gas is supplied into the wafer storage section 12 in advance to form an inert gas atmosphere, the oxygen concentration in the wafer storage section 12 is decreased to about several ppm. After that, heating is performed, and the contactor 11 and wafer W are pressed, the electrical connection therebetween improves. When the surface of the pad P is considerably oxidized, an inert gas such as nitrogen gas containing several % of a reducing gas such as hydrogen gas is supplied into the wafer storage section 12 and heated to 200° C. or more. With this operation, the oxide film on the pad P is reduced by the reducing gas, and the electrical connection between the pad P and contactor 11 improves. In this way, after satisfactory electrical connection is obtained between the contactor 11 and the wafer W, the contactor 11 is pressurized by the pressure mechanism 13. With this operation, the contactor 11 and wafer W are reliably electrically connected, and a reliable reliability evaluation test can be executed. At this time, the inert gas such as nitrogen gas or reducing gas such as hydrogen gas is removed from the exhaust port 22B. Since the space in the wafer storage section 12 is minimum, the use amount of the gas usage may be suppressed to minimum.

As described above, in this embodiment, the reliability evaluation test can be executed in the wafer form. All the wafer dicing process and assembly (packaging) process in the conventional method using a furnace can be omitted. As a result, the test time can be shortened, and the test cost can be greatly reduced. Especially, in the assembly process, it is difficult to directly bond a wire to the pad P made of copper or a copper alloy. For this reason, as shown in FIG. 8B, after a barrier layer B and pad layer P1 of aluminum are formed, a wire L must be bonded. In this embodiment, however, since the oxygen concentration in the wafer storage section 12 may be decreased to several ppm, the barrier layer B and pad layer P1 of aluminum can be omitted, as described above. As a consequence, the test cost can be further reduced. In the conventional method, an aluminum pad layer is necessary in addition to an aluminum barrier layer because the furnace is generally poor in sealing property. When the pad portion of copper or a copper alloy is oxidized during a test, it becomes difficult to ensure electrical connection.

Next, the heating mechanism 14 operates. The temperature of the heater 29 and auxiliary heater 29C increases. The heaters 29 and 29C heat the wafer W directly from the upper and lower sides. In this way, when the wafer W is sandwiched and heated by the heater 29 and auxiliary heater 29C from the upper and lower sides, the wafer W can be heated to a target temperature (350° C. at maximum) in a short time (e.g., within 1 hr). In addition, since the wafer storage section 12 has a heat insulating structure, any decrease in temperature due to heat dissipation from the wafer storage section 12 can be effectively suppressed. As a result, the wafer W can easily be maintained at the target temperature. The heater 29 may be constituted by the first and second heaters 29A and 29B which individually function. Even if heat is dissipated from the outer edge portion of the contactor 11, the outer second heater 29B reliably compensates for the dissipated heat component from the outer edge portion of the contactor 11 and maintains the entire surface of the wafer W at the target temperature. A variation in temperature distribution in the wafer W within the range of 160° C. to 350° C. may be suppressed to ±2.0° C. or less.

When an electromigration test is to be executed under a high temperature, as shown in FIG. 2, the connection board 15C of the EM measurement section 15A is brought into contact with the external connection terminal of the extended portion 25A of the wiring board 25. After that, the EM measurement section 15A simultaneously executes electromigration measurements of 512 devices in the wafer W. The tester section 16 analyzes the test result. In this case, by stably maintaining the wafer W at a high temperature of 350° C., the wafer W can be maintained in a state wherein movement of metal atoms in the copper interconnections of the devices is readily induced. As a result, the test result can be obtained in a short time, and each device on the wafer W can be evaluated in a short time.

When a current should be supplied to execute the electromigration test, the EM measurement section 15A according to this embodiment can supply three kinds of currents, i.e., a DC current, pulse DC current, and AC current. The conventional method using a furnace uses a scheme of supplying only a DC current, pulse DC current, or AC current. According to the reliability evaluation test apparatus 10 of this embodiment, the single apparatus can cope with three current supply schemes.

When the three kinds of currents are to be supplied, as a test pattern 77, a test pattern formed on the wafer W, as shown in, e.g., FIGS. 9A and 9B, can be used. These test patterns are normally most frequently used. Basic test patterns include a test pattern of a single terminal type which has a connection hole at an upstream end with respect to the flow of electrons, as shown in FIG. 9A, and a test pattern of double terminal type which has a connection hole at each of the upstream and downstream ends with respect to the flow of electrons, as shown in FIG. 9B. The test pattern of the single terminal type shown in FIG. 9A is used when electrons flow from the lower level interconnection to an upstream interconnection through the connection hole. Normally, a current density of 0.5 to 2.0 mA/cm$^2$ is employed in an acceleration test. However, a length L of a test metal interconnection needs to be set to a length at which no back flow effect occurs. An interconnection length L of 50 μm or more suffices, though it is preferably 100 to 200 μm. The test interconnection width normally changes depending on the device or the object of the test to be executed. Ten dummy interconnections can be normally laid out on each side, i.e., about 20 dummy interconnections can be laid out on both sides of a device around the interconnections to be tested. These dummy interconnections are laid out to obtain a target interconnection width while avoiding any proximity effect in the lithography process for forming a thin test interconnection and to detect extrusion of a metal as an interconnection material from the interconnection at the time of electromigration test. In the test, the extrusion is monitored basically by four-terminal measurement.

When a DC current is to be used, the test pattern of a single terminal type shown in FIG. 9A is used. An interconnection whose interconnection length L is set to 100 μm is used. When the test interconnection is made of copper or a copper alloy, the test temperature is preferably 250° C. to 350° C. When the test interconnection is made of aluminum or an aluminum alloy, the test temperature is preferably 150° C. to 250° C. The density of a current to be supplied is preferably about 0.5 to 3 mA/cm$^2$ to avoid any increase in temperature due to Joule heating. FIG. 10 shows a change in relative resistance value when the test pattern shown in FIG. 9A is used. As is apparent from FIG. 10, there is a long time (Incubation Time) in which the resistance value does not increase at all, and after that time, the resistance value abruptly increases (Growth Time). At this time, the time when the resistance value has increased to, e.g., 10% or 20% is defined as a Time To Failure. FIG. 11 shows cumulative failures when, e.g., 30 devices were simultaneously tested using the same test pattern. In FIG. 11, a log-normal distribution is used as a statistical distribution. The reliability evaluation test apparatus 10 can also simultaneously output a Weibull distribution and normal distribution in addition to the log-normal distribution. Referring to FIG. 11, the time up to 50% failure is defined as MTF (Median Time to Failure). The reciprocal of the gradient for linear approximation corresponds to the variation in electromigration. These two values are very important parameters in predicting the electromigration life for LSI.

When a pulse DC current is to be used, a pulse DC current shown in, e.g., FIG. 12 is supplied. In this case, the pulse frequency is important. A pulse frequency of, e.g., about 50 KHz to 10 MHz is necessary. The reliability evaluation test apparatus 10 according to this embodiment copes with this frequency. In the electromigration test using a pulse DC current, a transition in the moving mode of metal atoms occurs depending on the pulse frequency. The frequency of transition has been reported so far to be 100 KHz to several MHz. Hence, the reliability evaluation test apparatus 10 of this embodiment can properly measure the moving mode of metal atoms. When an AC current is to be supplied, it is important to change the frequency and the duty ratio ($t_{on}/t_{cycle}$) while keeping the same size of the area of the positive region and negative region of the frequency, as shown in FIG. 13. This is because it resembles the behavior of metal atoms which frequently occurs in an LSI circuit.

When an electromigration test is to be executed for devices in the wafer form, 512 devices can be simultaneously tested. To the contrary, in the conventional method using a furnace, only about 100 devices can be tested at maximum. Hence, the test capability is higher in the embodiment of the present invention by four- to five-fold. In addition, when the test pattern layout on the wafer W and the grouping function of test patterns of the reliability evaluation test apparatus 10 are used, very important data for development of techniques for increasing the reliability can be efficiently obtained at once, including the interconnection width dependence (identification of a main diffusion path) (FIGS. 14A to 14C), the critical length ($L_C$: Critical length) (FIG. 15A), and Reservoir length dependence (FIG. 15B). To the contrary, in the conventional method using a furnace, each package must be set every time each data is to be measured. This makes the test very cumbersome, and a long time is required to obtain a result.

In addition, when the devices formed on the wafer are tested, output parameters related to the reliability, for example, the distribution of TFT or initial resistance values in the wafer W state can be output as the wafer map shown in FIG. 16. For this reason, the distribution state can immediately be grasped. For example, referring to FIG. 16, the output result of the device, which is indicated by double □, indicates a change in relative resistance value shown in FIG. 10. From the cumulative failure distribution shown in FIG. 11, a change in relative resistance value with respect to time or cumulative failures with respect to time can immediately be seen. Hence, on the basis of the test result, data in object may be efficiently obtained in a short time. In addition, the tester section 16 can efficiently and accurately analyze the data in a short time. To the contrary, in the conventional method using a furnace, when devices are packaged after wafer dicing, labor is needed to put marks to discriminate between the devices. This may also lead to marking errors.

After the electromigration test, the test result can be transmitted from the reliability evaluation test apparatus 10 to the aligner 50 by data communication. The aligner 50 has a camera and microscope for alignment. Hence, when the tested wafer W is set in the alignment chamber 52, and a defective device is aligned to a position immediately under the microscope by the alignment mechanism, a failure such as a void due to electromigration can be immediately observed. In addition, the observation results of 512 test patterns can be stored as images. For example, if there is a device with an abnormal resistance behavior on the wafer map, the image of the device can be immediately displayed on the screen of the display apparatus 57. The camera of the aligner 50 can be operated in a manual mode as needed to observe a defective portion and a region around it at a high magnification. When resistance behaviors or void portions to be extracted are designated in advance, they can be automatically listed up after void observation by the aligner 50 after the test. To the contrary, in the conventional method using a furnace, each device is detached from the package and observed with a microscope. A lot of labor and time are required for the observation.

When the electromigration test is to be executed, the temperature distribution in the wafer W is controlled, e.g., ±2.0° C. within the range of, e.g., 160° C. to 350° C. The electromigration test can be executed under accelerated conditions of the temperature and current density. As test result, MTF and variation σ are obtained. After tests are executed under the different temperature conditions and different current density conditions, acceleration parameters $E_a$ (Activation energy) and n (Current exponent) are obtained. Finally, $J_{use}$ (Usage used current density at operating condition) is obtained. $J_{use}$ is preferably as large as possible. On the basis of the electromigration principle, the value n falls within the range of 1 (component of growth time) to 2 (component of incubation time). The value n changes depending on the formation accuracy of test patterns or the relative change resistance change ratio at which a device is regarded as a defective device. $E_a$ is an activation energy for diffusion, which is determined by the material and process used for formation of test patterns. The values $E_a$ and n are determined in accordance with the wafer W and not in accordance with the performance of the reliability evaluation test apparatus 10. To the contrary, the variation σ is affected by the performance of the reliability evaluation test apparatus 10. FIG. 17 shows the degree of influence of MTF and σ on $J_{use}$. As is apparent from FIG. 17, the influence of the variation σ is considerably large. In other words, when σ is large, e.g., 0.5 or more, the influence of the length of MTF is not observed. The variation σ occurs due to the wafer W (LSI manufacturing process) or the reliability evaluation test apparatus 10. The variation σ due to the reliability evaluation test apparatus 10 is preferably as small as possible. The variation σ generated by the reliability evaluation test apparatus 10 can be classified into two types: a variation caused by the temperature distribution in the wafer W and a variation caused by the variation in current. FIGS. 18A and 18B show a $J_{use}$ loss due to a current variation and σ $J_{use}$ loss due to the temperature distribution (variation), respectively. As is apparent from the calculation results, the loss due to the temperature distribution is enormous. To prevent this, the reliability evaluation test apparatus 10 directly and uniformly heats the entire wafer W using the heating mechanism 14 in a very small space, thereby suppressing the temperature distribution within the range of ±2.0° C. even under a high temperature of 350° C. Hence, the variation due to the reliability evaluation test apparatus 10 can be greatly suppressed, and an electromigration test can reliably be executed.

When leakage current measurement (Bias-Temperature Testing: BT test) or TDDB (Time Dependent Dielectric Breakdown) test is to be executed in addition to the above-described electromigration test, the connection board 15C of the EM measurement section 15A is switched to the connection board 15D of the BT measurement section 15B by the switching mechanism. With this switching, different tests can be conducted by the single apparatus. In the embodiment of the present invention, the conventional assembly process can be omitted. In addition, many devices can be tested at the same time. For this reason, the test cost can be reduced, and the test efficiency can be greatly increased.

FIGS. 19A to 19D show examples of test patterns used in a leakage current test. As shown in FIGS. 19A to 19D, this test pattern is basically a pattern different from an interdigital pattern, and a planar pattern or interconnection pattern laid out between interconnections. Referring to FIGS. 19B and 19D, hatched portions indicate the sections of interconnections viewed from the direction indicated by the alternate long and short dashed lines in FIGS. 19A and 19C, respectively. □ in FIGS. 19C and 19D indicates a contact hole to the upper interconnection. In the leakage current test, a voltage is applied while keeping the wafer W at a predetermined temperature, and a change in leakage current generated between the interconnections is monitored over time. The time until the leakage current reaches a predetermined value is the time to failure of the sample. As in the electromigration test, the distribution of the time to failure is plotted. In the leakage current test, the Weibull distribution satisfactorily matches the characteristic life.

In this test as well, many devices can be measured simultaneously, as in the electromigration test, and test results corresponding to test patterns can be put into groups. For this reason, a plurality of measurement data such as electric field dependence can be acquired simultaneously. When the pads for the electromigration test and leakage current test are arranged in the same contactor 11 in manufacturing the contactor 11, the electromigration test and leakage current test can be simultaneously conducted. However, the acceleration temperature in the electromigration test and leakage current test is limited to the same temperature. When different acceleration temperatures need to be used for the electromigration test and leakage current test, the reliability evaluation test apparatus 10 must be appropriately selectively used.

As described above, in this embodiment, the wafer storage section 12 which stores the wafer W which is totally in electrical contact with the contactor 11 can have the pressure mechanism 13 which presses the contactor 11 and the heating mechanism 14 which directly heats the wafer W that is totally brought into contact with the contactor 11 by the pressure mechanism 13. For this reason, a reliability evaluation test such as an electromigration test or leakage current test can be executed for 100 or more devices and, more specifically, 512 devices formed on a wafer. Since the process for dicing the wafer W into devices and the process for assembling each device after dicing are omitted, unlike the conventional method, the test cost can be reduced. In addition, a plurality of kinds of reliability evaluation test can be efficiently executed in a short time.

The wafer storage section 12 may have the table 22 on which the wafer W that is totally in electrical contact with the contactor 11 is placed, the connection ring 24 which surrounds the table 22 and comes into electrical contact with the contactor 11, and the wiring board 25 which comes into electrical contact with the connection ring 24 and supports the table 22. With this structure, the wafer storage space may be minimized. In addition, the temperature of the wafer W can be increased to 160° C. or more and, more specifically, 350° C. in a short time.

The pressure mechanism 13 may have the pressure plate 13A which comes into contact with the contactor 11, the metal bellows 13B having a lower end connected to the pressure plate 13A, the support plate 13C connected to the bellows 13B, and a means for supplying air into these members. With this structure, the contact pressure between the contactor 11 and the wafer W can be controlled to an optimum pressure by the air pressure.

The seal ring 26 may be arranged on the connection ring 24. The seal ring 26 comes into contact with the contactor 11, thereby sealing the space in the wafer storage section 12 from the outside. In addition, a means for supplying an inert gas such as nitrogen gas into the wafer storage section 12 is provided. With this structure, the oxygen concentration in the wafer storage section 12 may be decreased to 10 ppm or less and, more specifically, 1 to 5 ppm or less. As a result, since metal interconnections such as copper interconnections formed on the wafer W may be prevented from being oxidized, the contactor 11 and wafer W can be reliably electrically connected, and the reliability evaluation test can be reliably performed. A reducing gas such as hydrogen gas is added to the inert gas and supplied, as needed. Even when the metal pads are considerably oxidized, the oxide film may be reliably reduced, the contactor 11 and wafer W can be reliably electrically connected, and the reliability evaluation test can be reliably performed.

The heating mechanism 14 causes the first and second heaters 29A and 29B to heat the wafer W for the lower surface side and causes the auxiliary heater 29C to heat the wafer W from the upper surface side. With this structure, the two surfaces of the wafer W can be directly heated from the upper and lower sides to increase the wafer temperature to a target temperature (160° C. or more and, more specifically, 350° C.) in a short time. Since the wafer storage section 12 has a heat insulating hermetic structure, the temperature during the test can be properly maintained at the target temperature. In addition, the temperature distribution on the entire surface of the wafer W can be suppressed to ±2.0° C. or less. Hence, a reliable test result almost free from temperature variation can be obtained.

The EM measurement section 15A and BT measurement section 15B and a switching mechanism which alternately switches between the measurement sections 15A and 15B may be arranged. With this structure, the electromigration test and leakage current test can be simultaneously or alternately executed by the single apparatus by switching. Hence, the test efficiency can be greatly increased, and the test cost can be reduced.

This embodiment may have the function of supplying three kinds of currents, i.e., a DC current, pulse DC current, and AC current in the electromigration test. With this structure, in this embodiment, three kinds of tests may be executed simultaneously, and the test time can be greatly shortened. Additionally, in this embodiment, a plurality of test patterns formed on the wafer W can be put into groups. This embodiment has the grouping function of simultaneously executing tests for five or more groups in the plurality of groups. For this reason, since a plurality of parameters related to the reliability can be obtained by one test, the test efficiency and data analysis efficiency can be greatly increased.

In this embodiment, the contactor 11 may have the heat-resistant substrate 11A. The thermal expansion coefficient in the planar direction of the heat-resistant substrate 11A can be 1 to 50 ppm/° C. Even under a high temperature of 160° C. or more, and for example, at 350° C., the thermal expansion coefficient of the heat-resistant substrate 11A and that of the wafer W have little difference. Hence, the electrical connection between the contactor 11 and the wafer W can be reliably ensured. When the heat-resistant substrate 11A is made of at least one material selected from, e.g., a heat-resistant resin such as polyimide or bismaleimide-triazine, a heat-resistant resin with a reinforcement material (e.g., glass cloth or carbon fiber), a metal such as aluminum, copper, stainless steel, an invar alloy, or invar, a conductor such as silicon, and a ceramic mainly containing aluminum nitride or silicon carbide, the thermal expansion coefficient can be ensured. In addition, the insulating coating 11F can cover portions except the connection portion to the wafer W and the connection portions to the pogopins 24A of the connection ring 24. For this reason, any extra electrical contact between the contactor 11 and the wafer W may be prevented, and stable electrical connection can be ensured between the contactor 11 and the wafer W. The anisotropic conductive film 31 may be inserted between the contactor 11 and the wafer W. For this reason, the bumps of the contactor 11 can be reliably electrically connected to the electrode pads of the wafer W.

This embodiment may comprise the aligner 50 which totally brings the contactor 11 into contact with the wafer W, the wafer transfer tool 60 which integrally transfers the contactor 11 and wafer W, which are totally in contact with each other in the aligner 50, and the reliability evaluation test apparatus 10 which executes the reliability evaluation test of the wafer W using the contactor 11 which is stored through the wafer transfer tool 60 while being integrated. The aligner 50 reliably brings the bumps of the contactor 11 into contact with the electrode pads on the wafer W to integrate the contactor 11 and wafer W as a shell. Then, the shell is transferred to the reliability evaluation test apparatus 10 through the wafer transfer tool 60, and the reliability evaluation test apparatus 10 can reliably execute the reliability evaluation test. The reliability evaluation test apparatus 10 and aligner 50 may be designed to be capable of data communication. For this reason, the test result obtained in the reliability evaluation test apparatus 10 may be directly transmitted to the aligner 50. The aligner 50 can display the test result as a wafer map and use it. The aligner 50 can also have a microscope to be used to observe the wafer W on the basis of the test result. For this reason, a tested device can be designated on the wafer map. A void or the like of the designated device can be directly observed and effectively used for a process development later. The observation image may be stored by both of the aligner 50 and the reliability evaluation test apparatus 10.

In this embodiment, the wafer transfer tool 60 may have a magnet. Hence, the aligner 50 may properly integrate the contactor 11, anisotropic conductive film 31, and wafer W, which are totally in contact, as a shell and fix it. The contactor 11 and wafer W can be reliably transferred without any misalignment.

[Embodiments]

A method of manufacturing the contactor of the present invention and its performance will be described in detail with reference to FIGS. 22A to 22D.

First Embodiment

In the first embodiment, a case wherein the contactor 11 shown in FIG. 3 is manufactured will be described. First, a composition containing, e.g., 100 parts by weight of an aluminum nitride powder having an average particle size of 0.6 μm, 4 parts by weight of an yttria powder having an average particle size of 0.4 μm, 12 parts by weight of an acrylic resin binder, and 20 parts by weight of alcohol was sprayed and dried to prepare a granular composition powder. This granular composition powder was charged into a mold and molded into a flat plate shape to obtain a molded body (green). This molded body was hot-pressed at 1,890° C/ and 15 MPa for 10 hrs to obtain an aluminum nitride sintered body having a thickness of 5 mm. A disk-shaped substrate having a diameter of 310 mm was cut from the sintered body to obtain a heat-resistant substrate 11A shown in FIG. 20A. The thermal expansion coefficient in the planar direction of the heat-resistant substrate 11A was 4.5 ppm/° C.

Figure 20A:
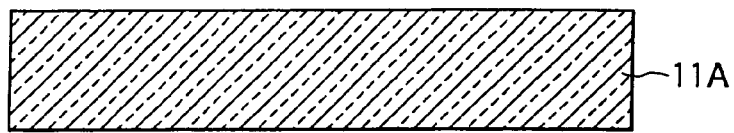
Figure 20B:
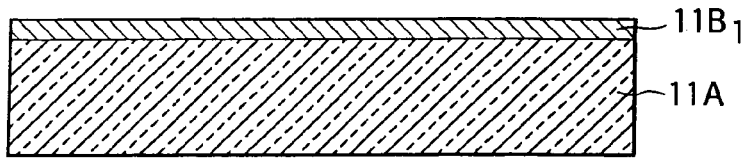
Figure 20C:
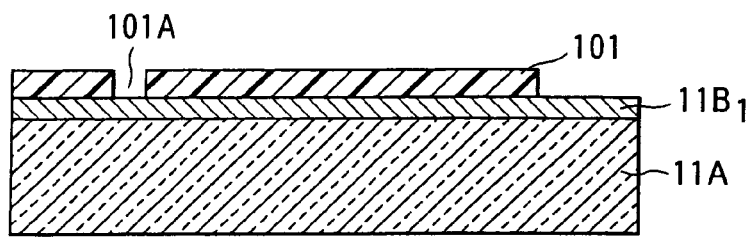
Figure 20D:
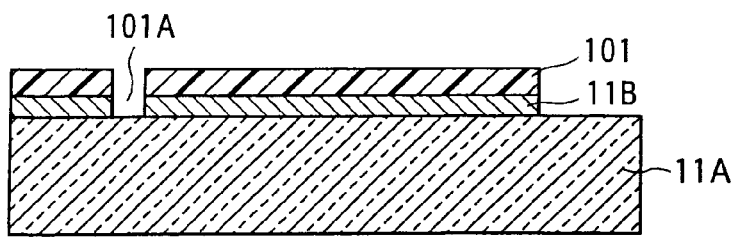
Figure 20E:
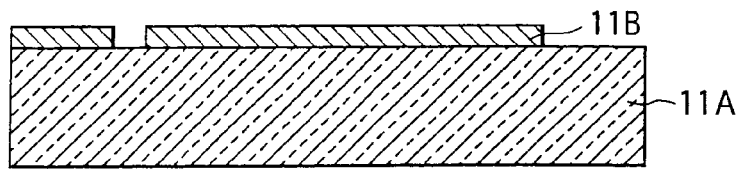

Next, copper was sputtered to the surface of the heat-resistant substrate 11A using a sputtering apparatus to form a copper thin film $11B_1$ having a thickness of 5 µm, as shown in FIG. 20B. The copper thin film $11B_1$ was laminated with a laminate film 101. The laminate film 101 was exposed and developed to form the etching resist film 101 having an opening 101A where the copper thin film $11B_1$ was partially exposed (FIG. 20C). After that, the copper thin film $11B_1$ except a portion where the etching resist film 101 was formed was removed using an aqueous solution of $HF/HNO_3$ ($HF/HNO_3$/water=1/1/2) at 55° C. (FIG. 20D). The etching resist film 100 was removed to form a conductor circuit 11B made of copper (FIG. 20E).

Figure 21A:
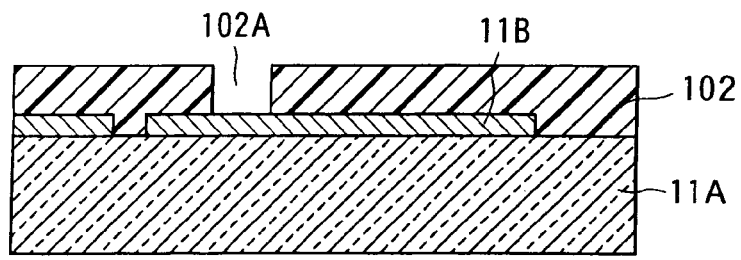
Figure 21B:
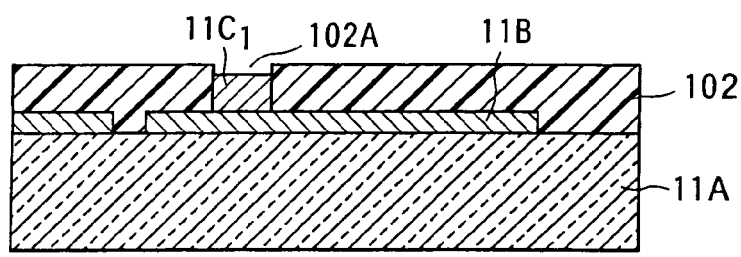
Figure 21C:
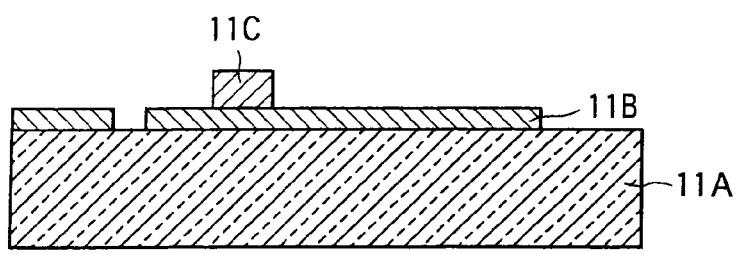
Figure 21D:
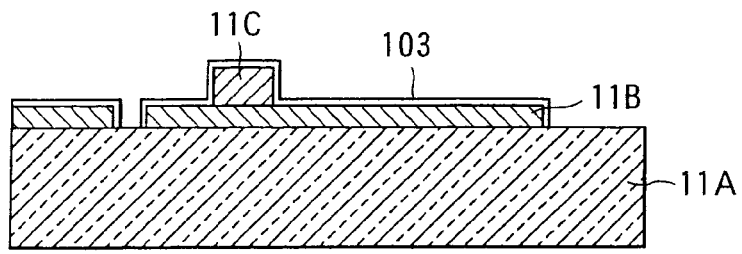

Next, a liquid resist for bump formation was applied to the major surface (the surface on which the conductor circuit 11B was formed) of the heat-resistant substrate 11A using spin coating. The resist was dried at a temperature of 160° C. for 20 min to form a resist coating film. The resist film was exposed and developed to form a plating resist film 102 having an opening 102A for bump formation, as shown in FIG. 21A. Nickel plating $11C_1$ was executed on the conductor circuit 11B from the opening 102A in an electroless nickel plating bath (FIG. 21B). After that, as shown in FIG. 21C, the plating resist film 102 was removed to form a bump 11C to be connected to the wafer W. In addition, a nickel plating film 103 was formed on the conductor circuit 11B and bump 11C (FIG. 21D).

Figure 22A:
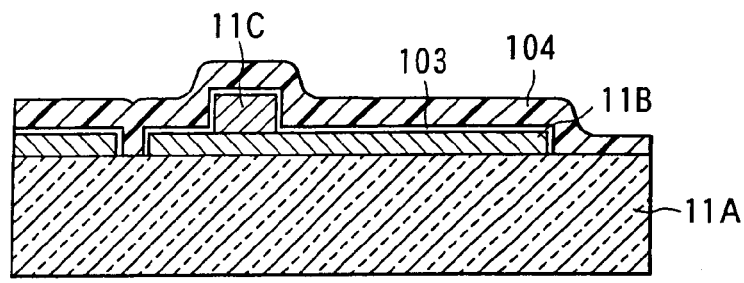
Figure 22B:
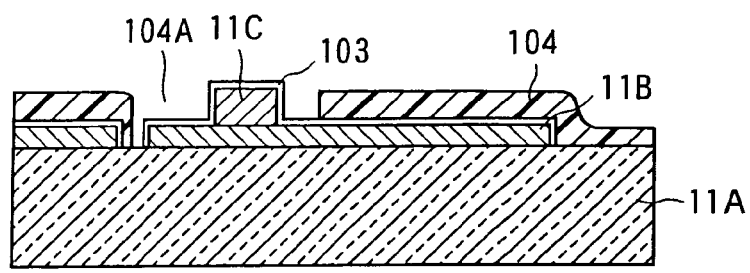
Figure 22C:
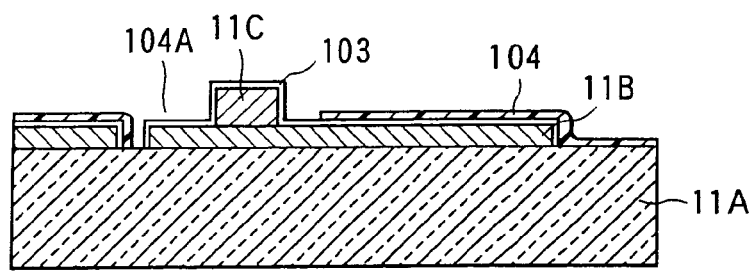
Figure 22D:
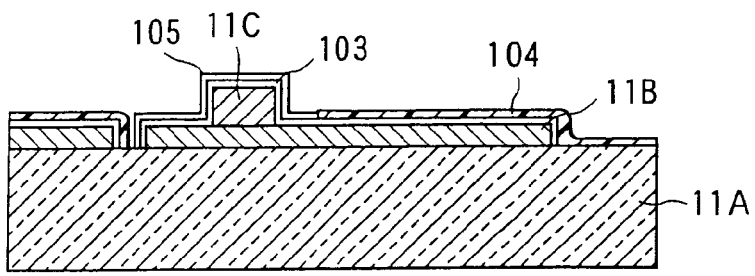

In addition, as shown in FIG. 22A, a solution of a photosensitive cardo polymer whose viscosity was adjusted to 30 Pa·s in advance was applied to the entire surface of the nickel plating film 103 and heat-resistant substrate 11A using spin coating and dried at a temperature of 160° C. for 20 min to form a photoresist film 104. Next, as shown in FIGS. 22B and 22C, a photo etching mask having solid circles formed at positions corresponding to bump opening portions was placed on the photoresist film 104. The photoresist film 104 was irradiated with UV light under a condition of 400 mJ/cm$^2$ to expose and develop the photoresist film 104, thereby forming a connection opening 104A for connection to the wafer W. In addition, as shown in FIG. 22D, rare metal (e.g., gold) plating 105 was executed on the bump 11C and conductor circuit 11B from the opening 104A. With this series of processes, the conductor circuit 11B and bump 11C were formed on the heat-resistant substrate 11A. Although not illustrated, an opening portion to which the connection pad portion 11E to be connected to the pogopin 24A of the reliability evaluation test apparatus 10 was exposed was formed in the same procedures as those of the series of processes (FIGS. 3A and 3B). The bump has a rectangular shape. The maximum length in the pitch direction was 75 µm.

Second Embodiment 2

In the second embodiment, a method of manufacturing the contactor 11 shown in FIG. 4 will be described. A composition containing, e.g., 100 parts by weight of a silicon carbide powder having an average particle size of 1.1 µm, 0.5 parts by weight of a boron carbide powder as a sintering assistant, 12 parts by weight of an acrylic resin binder, and 20 parts by weight of alcohol was sprayed and dried to prepare a granular composition powder. This granular composition powder was charged into a mold and molded into a flat plate shape to obtain a molded body (green). This molded body was hot-pressed at 2,100° C. and 17.6 MPa for 10 hrs to obtain a ceramic substrate which was made of silicon carbide and had a thickness of 3 mm. This ceramic substrate was dipped in a molten silicon at 1,500° C. to impregnate the ceramic substrate with the silicon solution. A disk-shaped substrate having a diameter of 210 mm was cut from the surface of the ceramic substrate to obtain a composite substrate. The thermal expansion coefficient in the planar direction of the composite substrate was 3.6 ppm/° C. A glass paste (G-523N: available from Shoei Chemical) was applied to the composite substrate. Then, the resultant structure was sintered at 600° C. for 1 hr to form a silicon oxide film 11G having a thickness of 2 µm on the surface of the composite substrate mainly containing silicon carbide, so a heat-resistant substrate 11A was obtained (FIG. 4). A conductor circuit 11B and the like were formed on the major surface of the heat-resistant substrate 11A in accordance with procedures similar to those described above.

More specifically, copper was sputtered to the surface of the heat-resistant substrate 11A using a sputtering apparatus to form a copper thin film having a thickness of 5 µm. The copper thin film was laminated with a laminate film. The laminate film was exposed and developed to form an etching resist film to which the copper thin film was partially exposed. After that, the copper thin film except a portion where the etching resist film was formed was removed using an aqueous solution of $HF/HNO_3$ ($HF/HNO_3$/water=1/1/2) at 55° C. The etching resist film was removed to form the conductor circuit 11B made of metal copper.

Next, a solution of a photosensitive cardo polymer whose viscosity was adjusted to 30 Pa·s in advance was applied to the entire major surface of the heat-resistant substrate 11A using spin coating and dried at a temperature of 150° C. for 20 min to form a resin layer made of a semi-hardened film of the photosensitive cardo polymer. Next, a photo etching mask having solid circles formed at opening positions corresponding to the pad portions of the wafer W and the connection pad portions 11E to the pogopins 24A of the reliability evaluation test apparatus 10 was placed on the resin layer. The resin layer was irradiated with UV light under a condition of 400 mJ/cm$^2$ to expose and develop the resin layer, thereby forming connection opening portions to be connected to the wafer W and opening portions to which the connection pad portions 11E to be connected to the pogopins 24A of the reliability evaluation test apparatus 10 were exposed. After that, the resin layer was completely hardened at 250° C. for 120 min to form the insulating coating 11F. In addition, a gold layer having a thickness of 0.03 µm was formed at each pad portion using a gold plating bath to obtain the contactor 11 shown in FIG. 4.

Third Embodiment

In the third embodiment, a polyimide substrate (the thermal expansion coefficient in the planar direction was 30 ppm/° C.) containing a glass cloth was used as the material of the substrate. This substrate was manufactured in the following way. A glass cloth was impregnated with polyimide resin. The resultant structure was dried at 80° C. for 1 hr to prepare pre-pregs as B stage. Ten pre-pregs were stacked, and the resultant structure was heated and pressed at 7.8 MPa and 120° C. for 1 hr. More specifically, copper was sputtered to the surface of the polyimide substrate using a sputtering apparatus to form a copper thin film having a thickness of 5 µm. The copper thin film was laminated with a resist film (DF available from TOKYO OHKA KK). The resist film was exposed and developed to form an etching resist film to which the copper thin film was partially exposed. After that, the copper thin film except a portion where the etching resist film was formed was removed using an aqueous solution of $HF/HNO_3$ ($HF/HNO_3$/water=1/1/2) at 55° C. The etching resist film was removed to form a conductor circuit 11B made of copper.

Next, a solution of a photosensitive cardo polymer whose viscosity was adjusted to 30 Pa·s in advance was applied to the entire major surface of the polyimide substrate using spin coating and dried at a temperature of 150° C. for 20 min to form a resin layer made of a semi-hardened film of the photosensitive cardo polymer. Next, a photo etching mask having solid circles formed at opening positions corresponding to the pad portions of the wafer W and the connection pad portions 11E to the pogopins 24A of the reliability evaluation test apparatus 10 was placed on the resin layer. The resin layer was irradiated with UV light under a condition of 400 $mJ/cm^2$ to expose and develop the resin layer, thereby forming connection opening portions to be connected to the wafer W and opening portions to which the connection pad portions 11E to be connected to the pogopins 24A of the reliability evaluation test apparatus 10 were exposed. After that, the resin layer was heated and completely hardened at 250° C. for 120 min to form an insulating coating 11F. In addition, a gold layer was formed on the surface of each connection pad portion to the wafer W and each connection pad portion to the reliability evaluation test apparatus 10 using a gold plating bath. Spire-shaped gold bumps are formed using a wire bonding apparatus, thereby obtaining a contactor.

COMPARATIVE EXAMPLE 1

In comparative example 1, a carbon fiber was used as a substrate material. For example, a carbon fiber (an article corresponding to T-300 available from Toray: fiber diameter: 15 μm) was mixed with phenol resin. The resultant mixture was hot-pressed under a temperature of 1,000° C. and at a pressure of 19.6 MPa to obtain, as a heat-resistant substrate, a carbon substrate whose thermal expansion coefficient in the planar direction was 0.9 ppm/° C. A glass paste (G-523N: available from Shoei Chemical) was applied to the carbon substrate. Then, the resultant structure was sintered at 600° C. for 1 hr to form a silicon oxide film having a thickness of 2 μm on the surface.

Copper was sputtered to the surface of the heat-resistant substrate using a sputtering apparatus to form a copper thin film having a thickness of 5 μm.

The copper thin film was laminated with a resist film (DF available from TOKYO OHKA KK). The resist film was exposed and developed to form an etching resist film to which the copper thin film was partially exposed. After that, the copper thin film except a portion where the etching resist film was formed was removed using an aqueous solution of $HF/HNO_3$ ($HF/HNO_3$/water=1/1/2) at 55° C. The etching resist film was removed to form a conductor circuit 11B made of copper.

Next, a solution of a photosensitive cardo polymer whose viscosity was adjusted to 30 Pa·s in advance was applied to the entire major surface of the heat-resistant substrate using spin coating and dried at a temperature of 150° C. for 20 min to form a resin layer made of a semi-hardened film of the photosensitive cardo polymer. Next, a photo etching mask having solid circles formed at opening positions corresponding to the pad portions of the wafer W and the connection pad portions 11E to the pogopins 24A of the reliability evaluation test apparatus 10 was placed on the resin layer. The resin layer was irradiated with UV light under a condition of 400 $mJ/cm^2$ to expose and develop the resin layer, thereby forming connection opening portions to be connected to the wafer W and opening portions to which the connection pad portions to be connected to the pogopins 24A of the reliability evaluation test apparatus 10 were exposed. After that, the resin layer was completely hardened at 250° C. for 120 min to form an insulating coating 11F. In addition, a gold layer having a thickness of 0.03 μm was formed on the surface of each connection pad portion to the wafer W and each connection pad portion to the reliability evaluation test apparatus 10 using a gold plating bath, thereby obtaining a contactor.

COMPARATIVE EXAMPLE 2

Comparative Example 2 is the same as Comparative Example 1 except that a phenol resin plate was used. The phenol resin substrate was prepared by supplying unhardened phenol resin into a mold made of fluorocarbon resin and hardening the resin at 120° C. The thermal expansion coefficient in the planar direction of this substrate was 60 ppm/° C.

For the contactors obtained in the above embodiments and comparative examples, the contact ratios between the wafer W and the contactors at 25° C. and 250° C. were obtained. A result shown in Table 1 was obtained. According to the result shown in Table 1, the contactors 11 of Embodiments 1, 2, and 3 exhibited a contact ratio of 100%. This indicates that the contactors can be used under a high temperature of 250° C. To the contrary, comparative examples 1 and 2 exhibited a contact ratio of 100% under a temperature like room temperature. However, the contactors cannot be used under a high temperature of 250° C.

TABLE 1

|  | 25° C. | 250° C. |
| --- | --- | --- |
| Embodiment 1 | 100% | 100% |
| Embodiment 2 | 100% | 100% |
| Embodiment 3 | 100% | 100% |
| Comparative Example 1 | 100% | 50% |
| Comparative Example 2 | 100% | 60% |

The present invention is not limited by the above embodiments, and the design of the constituent elements may be appropriately changed within the spirit and scope of the present invention. For example, when the pressure plate 13A of the pressure mechanism 13 is formed from an heat insulating material, and heat dissipation from the upper surface of the contactor 11 can be prevented, and the auxiliary heater 29C may not be arranged. In the embodiment, the anisotropic conductive film 31 is inserted between the contactor 11 and the wafer W. However, when the bumps of the contactor 11 and the electrode pads of the wafer W can elastically come into contact with each other, the anisotropic conductive film 31 may not be inserted.

The contactor of the present invention is not limited to the above embodiment. Any contactor having a heat-resistant substrate whose thermal expansion coefficient in the planar direction is 1 to 50 ppm/° C. is incorporated in the present invention. In addition, the contactor of the present invention may also be used for a purpose other than reliability evaluation testing.

EFFECT OF THE INVENTION

According to the present invention, there can be provided a reliability evaluation test apparatus, reliability evaluation test system, contactor, and reliability evaluation test method, which can quickly, efficiently, and reliably execute a reliability evaluation test of semiconductor devices in the wafer form and also greatly reduce the labor and cost required for the reliability evaluation test.

What is claimed is:

1. A shell for transferring a semiconductor wafer comprising:
   a contactor configured to execute a reliability evaluation test at a temperature of not less than 160° C., the contactor including:
   a heat-resistant substrate which has a thermal expansion coefficient of 1 to 50 ppm/° C.; and
   a conductor circuit which is formed on the heat-resistant substrate and includes contact pad portions,
   a wafer holder; and
   an outer connection terminal,
   whereby when performing a reliability evaluation test using a shell, a semiconductor wafer is mounted on the wafer holder, wherein the wafer holder, the semiconductor wafer, and the contactor are integrated in a state in which contact pad portions of the contactor and electrode pads of the semiconductor wafer are all brought into contact, an integrated shell is transferred to a reliability test apparatus, and the outer connection terminal is connected to a measurement section.

2. The shell according to claim 1, wherein the thermal expansion coefficient is that in a planar direction.

3. The shell according to claim 1, wherein the thermal expansion coefficient is 2 to 30 ppm/° C.

4. The shell according to claim 1, wherein the conductor circuit comprises a bump.

5. The shell according to claim 1, wherein an insulating coating is formed on a surface except a portion which is electrically connected in executing the reliability evaluation test.

6. The shell according to claim 1, wherein an insulating layer is formed on the heat-resistant substrate.

7. The shell according to claim 1, wherein an insulating layer is formed on the heat-resistant substrate, and a silicone oxide film is used as the insulating layer.

8. The shell according to claim 1, further comprising an anisotropic conductive film between the contact pad portions and the electrode pads.

9. The shell according to claim 1, wherein the wafer holder includes a magnetic material.

10. A shell for transferring a semiconductor wafer, comprising:
    a contactor configured to execute a reliability evaluation test at a temperature of not less than 160° C., the contactor including:
    a heat-resistant substrate which is formed from at least one material selected from a metal, a semiconductor, and a ceramic; and
    a conductor circuit which is formed on the heat-resistant substrate and includes contact pad portions,
    a wafer holder; and
    an outer connection terminal,
    whereby when performing a reliability evaluation test using a shell, a semiconductor wafer is mounted on the wafer holder, wherein the wafer holder, the semiconductor wafer, and the contactor are integrated in a state in which contact pad portions of the contactor and electrode pads of the semiconductor wafer are all brought into contact, an integrated shell is transferred to a reliability test apparatus, and the outer connection terminal is connected to a measurement section.

11. The shell according to claim 10, wherein the metal of the heat-resistant substrate is formed from at least one material selected from aluminum, copper, stainless steel, an invar alloy, and invar.

12. The shell according to claim 10, wherein the ceramic of the heat-resistant substrate is formed from at least one material selected from aluminum nitride and silicon carbide.

13. The shell according to claim 10, wherein the conductor circuit comprises a bump.

14. The shell according to claim 10, wherein the ceramic of the heat-resistant substrate is formed from at least one material selected from aluminum nitride and silicon carbide.

15. The shell according to claim 10, wherein an insulating coating is formed on a surface except a portion which is electrically connected in executing the reliability evaluation test.

16. The shell according to claim 10, wherein an insulating layer is formed on the heat-resistant substrate.

17. The shell according to claim 10, wherein an insulating layer is formed on the heat-resistant substrate, and a silicone oxide film is used as the insulating layer.

18. The shell according to claim 10, further comprising an anisotropic conductive film between the contact pad portions and the electrode pads.

19. The shell according to claim 10, wherein the wafer holder includes a magnetic material.

20. A shell for transferring a semiconductor wafer, comprising:
    a contactor, the contactor including:
    a heat-resistant substrate which is formed from at least one material selected from a metal, a semiconductor, and a ceramic; and
    a conductor circuit which is formed on the heat-resistant substrate and includes contact pad portions,
    wherein the contactor is used to execute a reliability evaluation test at a temperature of not less than 160° C. and includes a heat-resistant substrate having a thermal expansion coefficient of 1 to 50 ppm/° C.,
    a wafer holder; and
    an outer connection terminal,
    whereby a semiconductor wafer is mounted on the wafer holder, wherein the wafer holder, the semiconductor wafer, and the contactor are integrated in a state in which contact pad portions of the contactor and electrode pads of the semiconductor wafer are all brought into contact, an integrated shell is transferred to a reliability test apparatus, and the outer connection terminal is connected to a measurement section.

21. The shell according to claim 20, wherein the thermal expansion coefficient is that in a planar direction.

22. The shell according to claim 20, wherein the thermal expansion coefficient is 2 to 30 ppm/° C.

23. The shell according to claim 20, wherein the metal of the heat-resistant substrate is formed from at least one material selected from aluminum, copper, stainless steel, an invar alloy, and invar.

* * * * *

UNITED STATES PATENT AND TRADEMARK OFFICE
CERTIFICATE OF CORRECTION

PATENT NO. : 8,456,186 B2  
APPLICATION NO. : 11/769432  
DATED : June 4, 2013  
INVENTOR(S) : Kiyoshi Takekoshi et al.

It is certified that error appears in the above-identified patent and that said Letters Patent is hereby corrected as shown below:

On the title page, Item (73), the Assignees information is incorrect. Item (73) should read:

-- (73) Assignees: Tokyo Electron Limited, Tokyo (JP);  
Kabushiki Kaisha Toshiba, Tokyo (JP);  
Ibiden Co., Ltd., Ogaki-shi (JP) --

Signed and Sealed this  
Thirty-first Day of December, 2013

Margaret A. Focarino  
*Commissioner for Patents of the United States Patent and Trademark Office*